US008079125B2

(12) United States Patent
Ban et al.

(10) Patent No.: US 8,079,125 B2
(45) Date of Patent: Dec. 20, 2011

(54) MANUFACTURING METHOD OF MULTI-CHANNEL OPTICAL MODULE

(75) Inventors: Takuma Ban, Kodaira (JP); Yasunobu Matsuoka, Hachioji (JP); Masato Shishikura, Ome (JP)

(73) Assignee: Hitachi, Ltd., Tokyo (JP)

( * ) Notice: Subject to any disclaimer, the term of this patent is extended or adjusted under 35 U.S.C. 154(b) by 776 days.

(21) Appl. No.: 11/812,157

(22) Filed: Jun. 15, 2007

(65) Prior Publication Data

US 2008/0036103 A1 Feb. 14, 2008

(30) Foreign Application Priority Data

Aug. 9, 2006 (JP) .................................. 2006-216814

(51) Int. Cl.
*B23Q 17/00* (2006.01)

(52) U.S. Cl. ........ 29/407.09; 29/407.1; 385/92; 385/93; 385/94

(58) Field of Classification Search ................ 29/407.09, 29/407.1, 428; 385/92, 93, 94
See application file for complete search history.

(56) References Cited

U.S. PATENT DOCUMENTS

| | | | | |
|---|---|---|---|---|
| 5,260,587 A * | 11/1993 | Sato | ................................ | 257/88 |
| 5,574,814 A * | 11/1996 | Noddings et al. | ............... | 385/90 |
| 6,056,448 A * | 5/2000 | Sauter et al. | .................... | 385/92 |
| 6,340,251 B1 * | 1/2002 | Shibuya et al. | ................. | 385/89 |
| 6,422,761 B1 * | 7/2002 | Naghski et al. | ................. | 385/73 |
| 6,491,447 B2 * | 12/2002 | Aihara | ............................ | 385/92 |
| 6,798,955 B2 * | 9/2004 | Kunkel et al. | .................... | 385/52 |
| 6,839,474 B2 * | 1/2005 | Steinberg et al. | ............... | 385/14 |
| 6,921,214 B2 * | 7/2005 | Wilson | ............................ | 385/89 |
| 6,973,248 B2 * | 12/2005 | Kropp | ........................... | 385/131 |
| 6,985,647 B2 * | 1/2006 | Takamori | ....................... | 385/14 |
| 7,128,474 B2 * | 10/2006 | Giboney et al. | ................. | 385/92 |
| 2004/0067029 A1 * | 4/2004 | Wickman | ......................... | 385/88 |
| 2005/0123246 A1 * | 6/2005 | Morse et al. | .................... | 385/53 |
| 2006/0140544 A1 * | 6/2006 | Morimoto et al. | ............... | 385/59 |

FOREIGN PATENT DOCUMENTS

EP 1 310 811 A2 9/2002

* cited by examiner

*Primary Examiner* — David Bryant
*Assistant Examiner* — Jacob Cigna
(74) *Attorney, Agent, or Firm* — Stites & Harbison PLLC; Juan Carlos A. Marquez, Esq.

(57) ABSTRACT

An object of the present invention is to provide a technique making it possible to easily manufacture a multi-channel optical module in which optical elements are air-sealed.

In the optical module, a package 111 with optical elements mounted thereon is sealed with a transparent plate 109. Above a sealing window of the package, a lens plate 105 having holes 104 or grooves 201 and engagement pins 101 are engaged and optically aligned with each other.

17 Claims, 24 Drawing Sheets

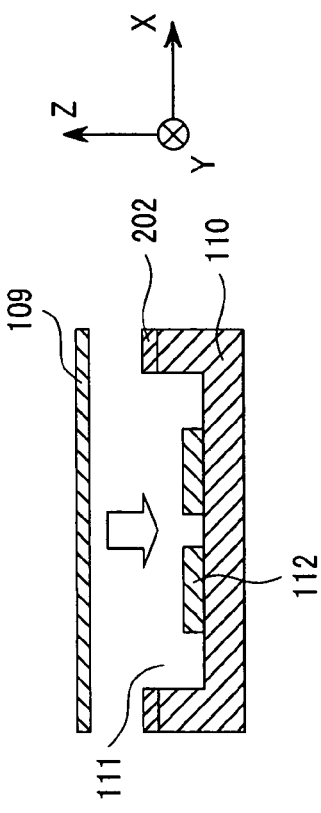
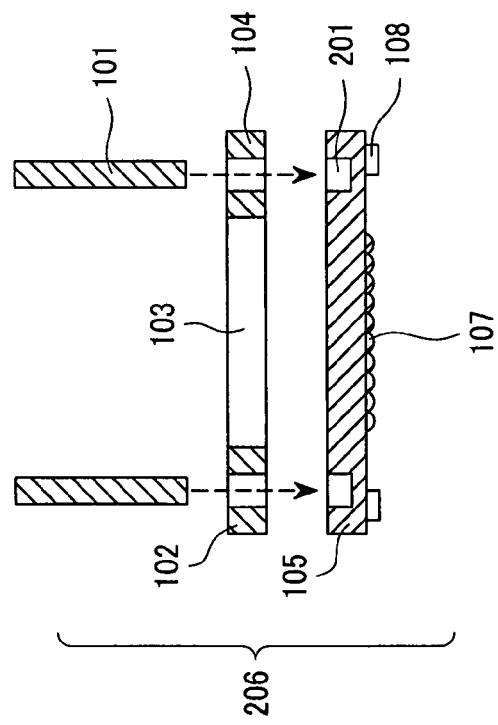
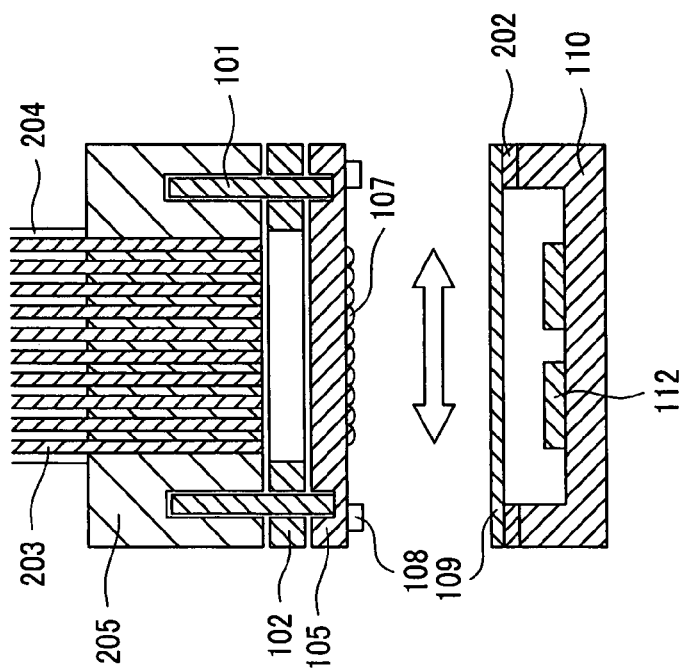

MANUFACTURING METHOD OF MULTI-CHANNEL OPTICAL MODULE

CLAIM OF PRIORITY

The present application claims priority from Japanese Patent Application JP 2006-216814 filed on Aug. 9, 2006, the content of which is hereby incorporated by reference to the application.

BACKGROUND OF THE INVENTION

1. Field of the Invention

The present invention relates to a method of manufacturing a multi-channel optical module, and more particularly, to a method of manufacturing a parallel optical transmitter module and a parallel optical receiver module which respectively transmits and receives optical signals using multi-channel optical arrayed elements, in the field of optical communications.

2. Description of the Related Arts

With the rapid spread of the Internet in recent years, the transmission capacity available for each service provider in the backbone optical network has drastically increased. As a result, the demand for optical modules for intra-devices or inter-devices connection with large capacity, low cost, and low power consumption, has been increasing in offices where large-capacity routers and multi optical transmitters are used.

The optical modules which satisfy the above requirements are often proposed in recent years, and especially from the view point of low price and low power consumption, there have been well known the types of the optical modules using surface light-emitting elements such as VCSEL (Vertical Cavity Surface Emitting Laser) as a source of luminescence, and surface photo acceptance elements such as a PIN photodiode for a photoelectric converter receiving light. Furthermore, multi-channel optical modules are often used, which have plural channels of optical elements arrayed with a pitch of 250 μm for mass storage, utilizing the characteristics of VCSEL's low power consumption. Recent multi-channel optical modules require a transmission rate of 10 Gbit/s or more per channel because of increasing demand for mass storage. Also, with the demand for high optical coupling, a micro-lens array is used for this type of optical module to enable high optical coupling with arrayed optical elements and optical fiber array. In order to prevent stray light among neighboring channels, the maximum lens diameter of micro lens array is 250 μm which is equal to the channel pitch between the optical elements. There are the following requirements for manufacturing optical modules, since the lens diameter, the optical element, and the channel pitch of lens array are as small as 250 μm:

a) For optical coupling of a light-emitting element and micro lens array component, the optical element is required to have a beam angle θ of around 20° to 30°. When the distance between an optical element and a micro-lens array is too large, the beam becomes wider than the lens diameter and causes optical loss, and then, may enter the micro-lens array component in the neighboring channels as stray light to cause a serious damage to quality of signals. Therefore, the optical path length between the optical element and the lens should satisfy the expression of $2L < 250/\tan(\theta/2)$. For instance, if the approximate tangent θ is equal to 25°, the optical path length L is optimal at around 500 μm and below. As described above, the light-emitting-element and micro lens array component should be arranged with close proximity around several hundreds μm.

b) AS described in a) above, in an optical module with closely arranged optical parts, in particular, alignment of micro-lens array and light-emitting element needs extreme accuracy. For instance, suppose that a laser with 25 degree of full angle of output light-emitting element and multi-mode fiber with the curvature radius of 50 μm are optically coupled using a convex lens with the radius 250 μm and the curvature radius of 170 μm. It is defined in the following description that the direction of the optical axis is in the Z-axis direction, and a direction perpendicular to the optical axis is X-axial and Y-axial directions. When the optical element is displaced by ±60 μm in the Z-axial direction, and by ±8 μm in the X- or Y-axial direction from the relative location for maximum coupling efficiency of optical components, the efficiency will be deteriorated by more than 1 dB. When the optical fiber is displaced by ±17 μm in the Z-axial direction, and by ±16 μm in the X- or Y-axial direction, the efficiency will be deteriorated by around 1 dB. In particular, when an optical element, a lens, and a fiber are coupled, positional displacement in the X- or Y-axial direction significantly affects the efficiency of optical coupling, and therefore, this gap should be suppressed within several μm to several tens of μm.

Furthermore, the multi-channel optical modules generally need the following requirements.

c) In order to secure reliability of optical elements, the optical elements need to be air-sealed, prevent inflow of outside air. Thus, optical elements are surrounded by inorganic materials such as metal, ceramics, and glass. However, air-sealing windows, which transmit signal light rays, are made of glass or translucent ceramics.

d) Optical modules need optical connectors to be inserted for exchanging optical signals with the outside. In the optical system comprising an outer optical connecter and an inner optical module, pins for alignment are commonly used to fix alignment. Since some stress is loaded on pins for alignment with insertion of the optical module, some sort of structure is necessary to fix the pins in the optical module. EP Patent Application No. 1310811A2 (Patent Reference #1) discloses an example of optical modules satisfying the above requirements a) to d).

FIG. 29 illustrates an aspect of a conventional technique of example 1. An optical element 112 is mounted on a plate 2904, and is easily air-sealed by fixing the plate 2904, a LIP 2903, and a lens plate 2905 with low melting point glass or solder. The distance between the lens plate 2905 and the optical element 112 is adjusted with the thickness of the LIP 2903, and the two components can be arranged at positions closed to each other. An alignment pin 101 is firmly fixed on an overlay 2901 mounted on the lens plate 2905. The alignment pin 101 is not directly fixed on the lens plate 2905, because the lens plate 2905, which is made of fragile materials such as glass and ceramics, is weak to a bending stress and broken by an intensive stress to the fixed component, when the alignment pin 101 is directly fixed to the lens plate 2905. The point stress on the alignment pin 101 can be changed to the surface stress on the overlay 2901 by fixing the alignment pin 101 on the overlay 2901. As a result, mechanical reliability is improved by mounting the overlay 2901 on the lens plate 2905.

SUMMARY OF THE INVENTION

The optical module in the above conventional example 1 has the following problems in the manufacturing process.

A first problem is that there are many active alignment steps. In the active alignment step, optical alignment is performed by applying a voltage on the optical elements while monitoring strength of output current and optical signals intensity when a lens, a fiber, and an optical element are placed in the position adapted to optical coupling. When assembling the optical module in the conventional example 1, it is necessary to have a process for fixing a lip section 2903 on the plate 2904 after an active alignment of the lens plate 2905 and the optical element 112. In addition, there is another step necessary for mounting and fixing after an active alignment process of the overlay 2901 with the alignment pin 101 to lens plate 2905. In other words, assembling the optical module in the conventional example 1 takes time and costs for manufacturing because two times of active alignment processes are needed.

A second problem is that the manufacturing process for the module becomes complex because the lens plate 2905 has the two functions as the optical light focusing (a lens component 107) function and the air sealing function. The optical module in the example 1 of the conventional technique needs air sealing of the optical element 112, and in addition, the lip section 2903 and the plate 2904 need to be bonded with low melting point glass or solder after accurate optical positioning of the lens plate 2905 relative to the optical element 112. When using the most common re-flow method, a tension from the melted glass and solder causes positional displacement in the lip section 2903 and the plate 2904, and such displacement becomes several tens to several hundred µm, and deteriorates the optical coupling efficiency. Therefore, the simple and common process described above cannot be used in the manufacturing process for the module, and instead, an appropriate assembling device is needed so that active alignment processes and an air sealing process are carried out after fixing the lens plate to a core head with an internal optical fiber. Even the appropriate assembling device prepared, the processes are still complicated because the lens component 107 of the lens plate and the optical fiber in the core head should be placed at optically right positions.

It is an object of the invention is to provide a method of manufacturing a multi-channel optical module which resolves the problems for manufacturing described in Example 1 of the conventional technique, while fulfilling the requirements (a) to (d) for configuring the multi-channel optical module mentioned above.

The object is achieved with methods described below.

(1) A method of manufacturing an optical module according to the present invention includes the steps of: preparing a package 110 with optical elements mounted therein, a transparent plate 109 capable of transmitting a light signal to the optical elements, engagement pins 101, a member 102 (corresponding to the "member 1" described in embodiments) that has holes allowing insertion and engagement of the engagement pins 101 and an opening through which optical signals can pass or is partially made of a transparent material, a micro-lens array plate 105 having grooves or through-holes for the engagement pins 101, two planes nearly parallel to each other for input/output of the light signal, and micro lenses arranged on at least one of the surfaces thereof; air-sealing the package 110 with the transparent plate 109 and fixing material; inserting and engaging the engagement pins 101 into and with the member 1; engaging portions of the engagement pins 101 that have been inserted into the member 1 with the groove or the hole formed in the micro-lens array plate 105; and optically aligning the micro-lens array plate 105 with the optical elements.

The coordinate system is defined as described below. When the optical elements with the light-emitting elements are fixed at prescribed place in the package 110, the direction of optical axis of output optical signal passing through the transparent plate 109 is in the positive direction of the Z axis.

The package is made of ceramics and metals and the like. Generally the material includes multilayered or mono-layered ceramic plate with patterns of metallic electrical wirings or via holes provided thereon, a metal plate coupled with a ceramic plate. However, a configuration is allowable in which other kinds of ceramic, glass, plastic and the like are mounted at least on a portion of the ceramic plate.

At the prescribed place of the package, one or more light-emitting or light-receiving elements are mounted, or two or more optical devices that include one or more light-emitting/receiving elements are mounted. The optical devices that include more than two light-emitting/receiving elements generally means multi-channel arrayed optical devices comprising light-emitting/receiving elements arrayed with a pitch of 250 µm. Also a configuration is allowable in which electrical elements such as an IC, a capacitor, an inductor, and a register are mounted at the prescribed place of the package 110.

The transparent plate 109 is made of an inorganic material such as glass or translucent ceramic and allows transmission of at least a portion of an optical signal. Also a configuration is allowable in which a dielectric material is deposited on the transparent plate 109 in order to minimize reflection light with a wavelength used in the device. When the optical elements mounted in the package 110 are fixed with a portion of the package 110 for air-sealing, inorganic materials such as solder and low melting point glass is used as a fixing material.

Each engagement pin 101 has a cylindrical form at least partly. Each engagement pin 101 is made of materials such as metals or plastics. At least two engagement pins 101 are used for alignment of the materials. Each engagement pin 101 at least partly has a cylindrical structure with the diameter of about 0.7 to 0.69 mm, and is utilized for a normal MT connector and an MPO connector and the like.

The member 1 is made of metals, plastics, ceramics and the like. The member 1 has at least two holes enabling insertion of the engagement pins 101. A notched portion or a transparent member is provided to allow for passage of optical signals. In order to fix the engagement pins 101 and the member 1 (102), the engagement pins 101 are pressed and inserted into the holes or any of the fixing materials including resins, solders, and low melting point glass is used.

The micro-lens array plate 105 includes two or more surfaces that are substantially planar, and a lens member 107 on either of the surfaces of the micro-lens array plate 105. The optical axes of an incident optical signal into the micro-lens array plate 105 and that of an output light signal are substantially identical. Since the micro-lens array plate 105 is not used for air-sealing, holes or grooves may be provided to engage the engagement pins 101 therein.

The optical elements are mounted inside the package. In order to connect the optical elements, the electrical elements, patterns of electrical wirings and the like with each other, wire bonding and soldering may be employed.

When the package is air-sealed by the transparent plate 109, inorganic materials such as metallic solder and low melting point glass are used as fixing materials to weld the package and the transparent plate 109. In the process of air-sealing, the way of mounting of the transparent plate 109 does not cause a large change in the optical signal paths. Therefore, the transparent plate 109 does not need accurate alignment with the package 110 so as to facilitate the air-sealing process.

There is no specific restriction over a sequence of the steps described above so long as the multi-channel optical module operates properly.

2) In one example of the method of manufacturing the optical module according to the present invention, the micro-lens array plate 302 (corresponding to the "lens plate with a mirror surface" in Examples described hereinafter) has two surfaces nearly vertical to each other through which an optical signal is input or output. In addition, micro lenses are arrayed on at least one of the surfaces of the micro-lens array plate 302. The micro-lens array plate 302 also has a reflecting surface inclined at 450 of angle relative to the two plane surfaces of the micro-lens array plate 302.

A light axis of the light received from either one of the two surfaces is converted into a light axis having an angle vertical to the reflecting surface, and the light is emitted from one of the surfaces, which does not receive light. Hereinafter, in descriptions of the micro-lens array plate 302 having the reflecting surfaces when the point on the surface at which the optic axis is converted is defined as an original point, the light is transmitted in the X-axial direction and the Y-axial direction. In the portion on the surface from which the optical signal is transmitted, at least one lens element is arranged. The array lens plate has a groove or a hole for inserting an engagement pin 101.

3) A method for manufacturing an optical module according to the present invention includes the following steps: preparing the package 110 with the optical elements mounted therein, the transparent plate 109 capable of transmitting an optical signal to the optical elements, the engagement pins 101, a second material (corresponding to the "member 2" described in the embodiment) having holes allowing insertion and engagement of the engagement pins 101 so that the engagement pins 101 are substantially vertical to a main surface of the transparent plate 109, and a micro-lens array plate 302 having two surfaces that are adapted to input and output the optical signal and are substantially vertical to each other, a reflecting surface mounted with an angle of 45 degrees relative to the two surfaces, groove or holes capable of inserting the engagement pins 101 to one of the two surfaces, and micro-lenses arrayed on at least one of the two surfaces; air-sealing the package 110 by using the transparent plate 109 and a fixing material; inserting and engaging the engagement pins 101 into and with the member 2; engaging portions of the engagement pins 101 that have been inserted into the member 2 with the grooves or the holes formed in the micro-lens array plate 302; optically positioning the micro-lens array plate 302 relative to the optical elements; and fixing the member 2 to the package 110 or to at least a portion of the transparent plate 109.

According to the present invention, with the process described above, the method of manufacturing a multi-channel optical module requires an active alignment step only once and does not require an optical positioning upon air-sealing, which makes it possible to provide a highly productive technique.

BRIEF DESCRIPTION OF THE DRAWINGS

FIG. 2A is a cross-sectional view illustrating a typical process of manufacturing the basic structure of the optical module according to the first embodiment.

FIG. 2B is a cross-sectional view illustrating the typical process of manufacturing the basic structure of the optical module according to the first embodiment.

FIG. 2C is a cross-sectional view illustrating the typical process of manufacturing the basic structure of the optical module according to the first embodiment.

DETAILED DESCRIPTION OF THE PREFERRED EMBODIMENTS

Embodiments of the present invention are described in detail below with reference to the drawings.

First Embodiment

Figure 1:
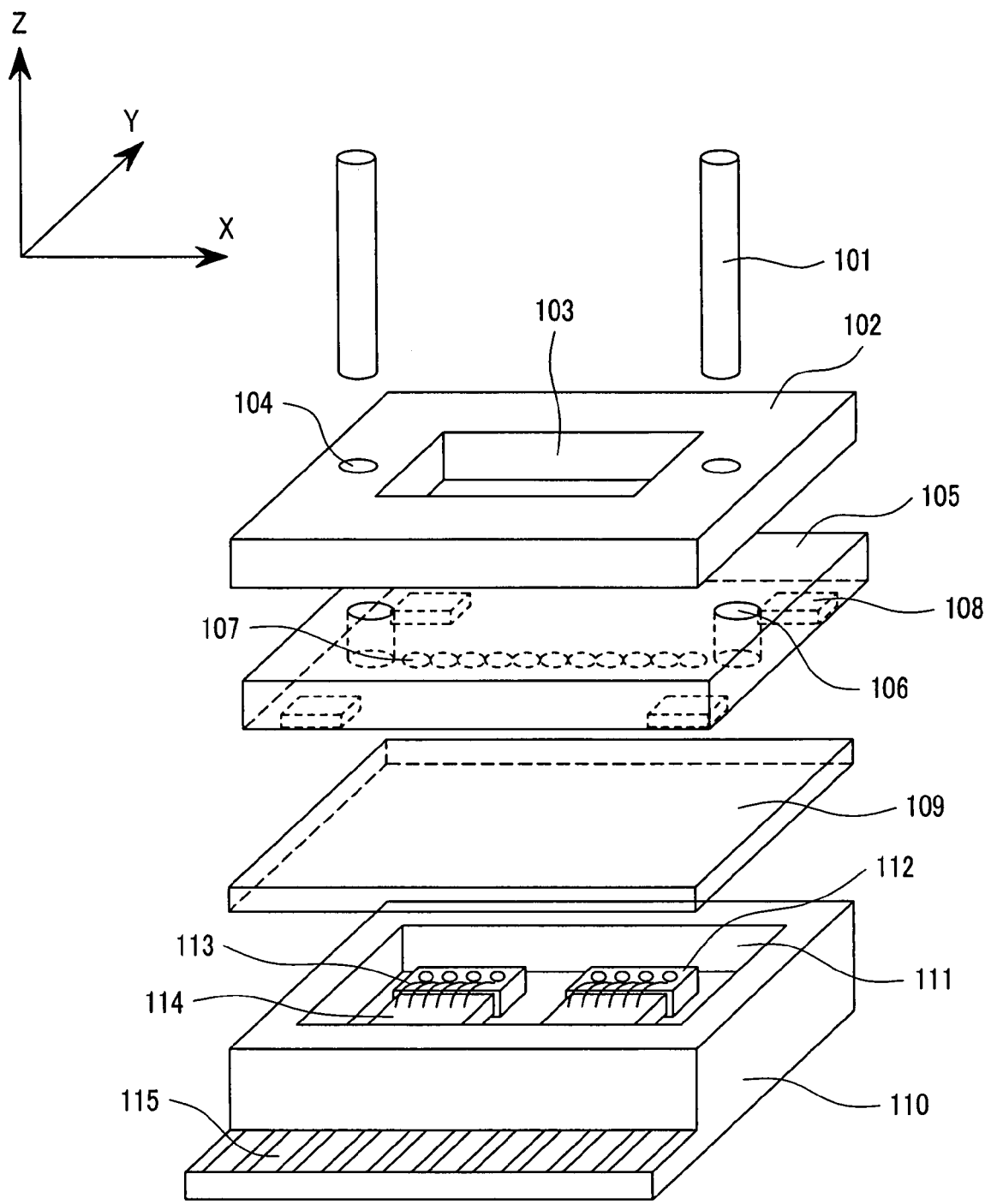
FIG. 1 is a perspective view illustrating a basic structure of a multi-channel optical module according to a first embodiment of the present invention.

FIG. 1 is a perspective view illustrating a configuration of the multi-channel optical module according to the present invention. Optical elements 112 and electrical elements 114 are mounted on a concave portion 111 of a package 110 and connected with each other by use of wire lines 113. An electric wiring pattern 115 is conducted to the electric wiring pattern placed in the concave portion 111. In order to air-seal the concave portion 111, a transparent plate 109 is fixed to the package 110. A micro-lens array plate 105 is located at a high position in the Z axis direction. Lens elements 107 are fixed on a surface facing the side of the optical elements 112. Convex sections 108 provided on the micro-lens array plate 105 are adapted to prevent the microscopic lens elements 107 from colliding with the transparent plate 109. The convex sections 108 are used to make a space between the transparent plate 109 and the micro-lens array plate 105. This is effective to prevent a fixing material from coming into the lens elements 107 due to the surface tension when the micro-lens array plate 105 and the transparent plate 109 are fixed by using the fixing agent such as resin. The engagement pins 101 are fixed to the member 102 when the engagement pins 101 are inserted into engagement pin holes 104 formed in the member 102. Then, the engagement pins 101 are inserted into engagement pin holes 106 formed in the micro-lens array plate 105. A notched portion 103 is a long hole and formed in the member 102 not to interfere the optical path of optical signals.

FIGS. 2A to 2C are cross-sectional views each illustrating a first multi-channel optical module to explain the method for manufacturing the same. The package 110 and the transparent plate 109 are fixed and sealed by a fixing material 202 for sealing such as low melting point glass and solder. The engagement pins 101 are inserted into the engagement pin holes 104 formed in the member 102 and into engaging pin grooves 201 formed in the micro-lens array plate 105 so as to form a lid section 206. The lid section 206 is aligned and fixed to an optical connector 205 with the engagement pins 101. A voltage is applied to the optical element 112 so that it operates. If the optical elements 112 are light-emitting elements, light power output through a fiber 203 is monitored. If the optical elements 112 are light-receiving elements, strength of the optical signal output from the optical elements 112 upon receiving optical signals from the fiber 203 is monitored. According to the monitored values, the active alignment is performed to align the lid section 206 with the optical elements 112 so as to obtain an optically proper positional relationship, and the lid section 206 is fixed on the upper side of the transparent plate 109. Namely, it is required to perform active alignment only once during the manufacturing process.

For instance, the engagement pins 101 and the member 102 may be fixed after the active alignment for the micro-lens array plate 105 with the optical elements 112 is performed and the micro-lens array plate 105 is fixed to the upper side of the transparent plate 109. When the prepared materials are substantially identical, the first multi-channel optical module can be manufactured by performing active alignment only once.

Figure 9A:
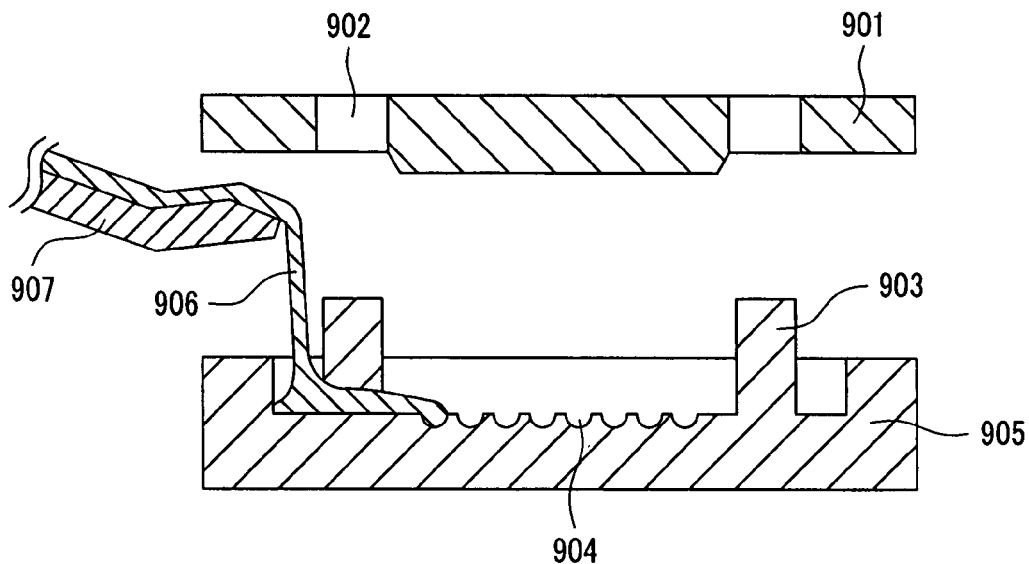
FIG. 9A is a cross-sectional view illustrating a typical process of preparing a micro-lens array plate used in the present invention.
Figure 9B:
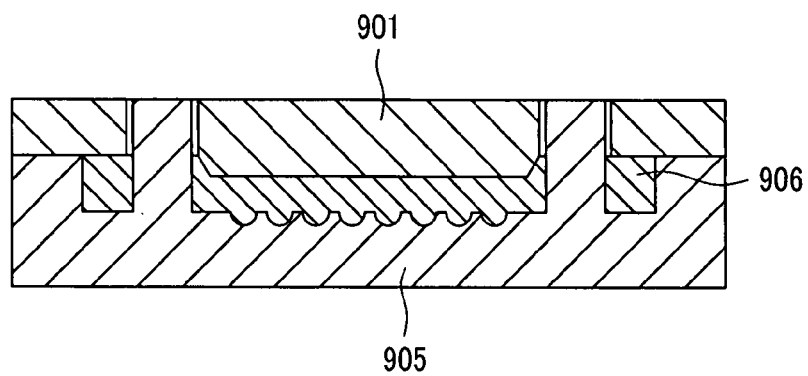
FIG. 9B is a cross-sectional view illustrating a typical process of preparing a micro-lens array plate used in the present invention.
Figure 9C:
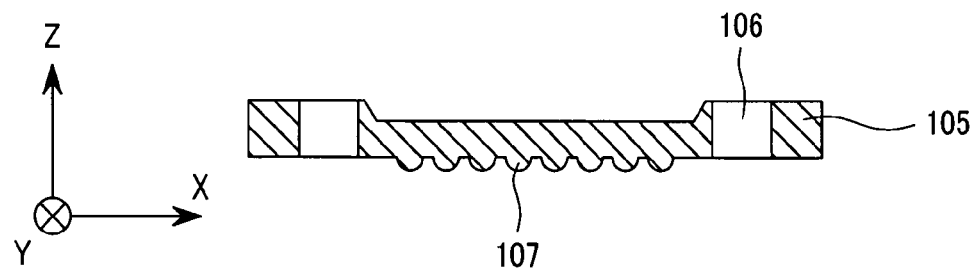
FIG. 9C is a cross-sectional view illustrating a typical process of processing a micro-lens array plate used in the present invention.

An example of the method of manufacturing the micro-lens array plate 105 used in the present invention is shown in FIG. 9. A lens material 906 with viscosity is poured into a lower mold 905 with grooves 904 for lenses and column 903 used for the engagement pins and the like provided thereon. Subsequently an upper mold 901 and the lower mold 905 are fitted to each other so as to solidify the lens material.

Since the micro-lens array plate 105 is not used as an air-sealing substance, there are provided the advantages as described below. Since the micro-lens array plate 105 does not need to be heated for air-sealing, the materials like plastics and glasses having a low melting point can be used as the lens materials. Not only the lens element 107 but also projections, holes, grooves and the like can easily be provided easily by using plastics or low melting point glasses. Especially, the plastics and low melting point glasses can be used in a casting process with molds, and a guide hole and a groove for an engagement pin or lens element can be manufactured in batch by casting.

As described above, the method of manufacturing multi-channel optical module proposed according to the present invention has the advantages that the process for air-seal is easy, and the process for active alignment is needed only once during the entire manufacturing process.

The method of manufacturing according to the present invention, the micro-lens array plate 105 may have holes or grooves for insertion of the engagement pins 101 along the Y-axial direction. In the process of alignment of the micro-lens array plate 105 with the optical elements, an optical connecter available from the market such as the MT connector and the MPO connector and the engagement pins 101 can be used so as to reduce the working cost.

Second Embodiment

Figure 3A:
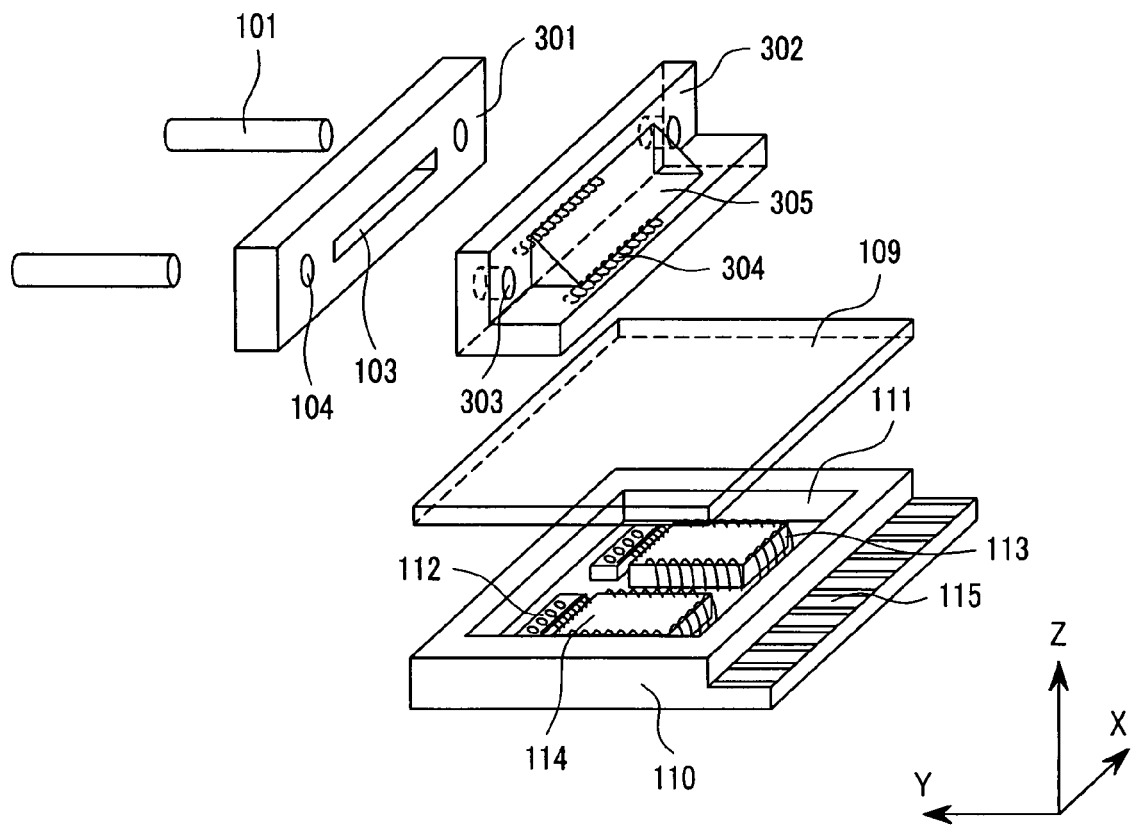
FIG. 3A is a perspective view illustrating a basic configuration of a multi-channel optical module according to a second embodiment of the present invention.
Figure 3B:
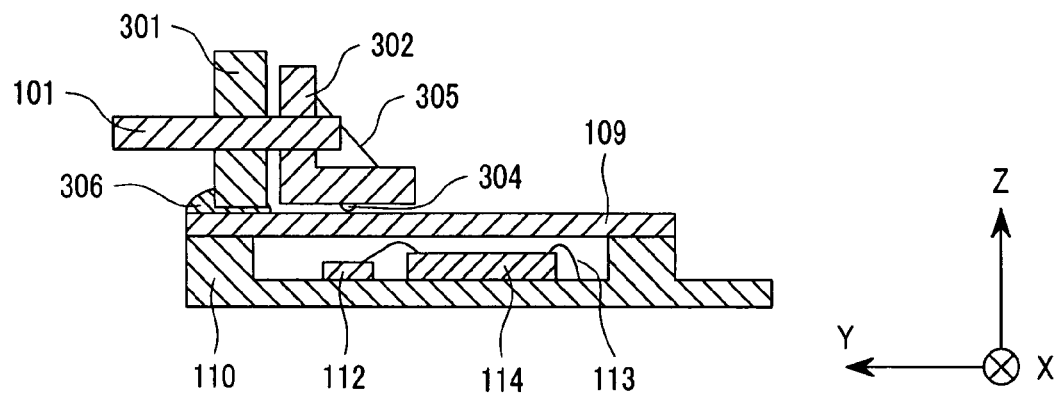
FIG. 3B is a cross-sectional view illustrating a basic configuration of the multi-channel optical module according to the second embodiment.

FIGS. 3A and 3B are respectively a perspective view and a cross-sectional view illustrating a configuration of a second multi-channel optical module according to a second embodiment of the present invention. A lens plate with mirror 302 is located on a transparent plate 109. A mirror plane 305 has a function of converting an optical axis extending substantially along the Z-axial direction to an optical axis extending substantially along the Y-axial direction. In a typical method for manufacturing an optical module illustrating in this example, the transparent plate 109 is sealed and fixed on the package 110. A member 2-1 (301) is engaged with the lens plate 302 having a mirror thereon by using engagement pins 101 from the positive side in a Y-axial direction and actively aligned with optical elements 112. Then, the member 2-1 (301) is fixed firmly on the transparent plate 109 using resin 306.

Besides the afore-mentioned process, it is also possible to manufacture the second multi-channel optical module by performing active-alignment once in a case where members similar to those described above are prepared.

When at least a portion of the member 2-1 (301) is arranged toward the positive side in the Y-axial direction against the lens plate 302 having with the mirror to manufacture an optical module, the optical module manufactured through this manufacturing process has the following advantages. Since the member 2-1 (301) is located between an external optical connector and the lens plate 302 having the mirror 305, the lens element 107 of the lens plate 302 with the mirror is rarely damaged even if foreign particles come in when the external optical connector is inserted into the module. Furthermore, there is another advantage that pressure of the insertion of the external optical connector is mostly applied to the member 2-1 (301) and is little applied to the lens plate 302 having the mirror, which provides the effect of enhancing mechanical reliability of the completed optical module.

Third Embodiment

Figure 4A:
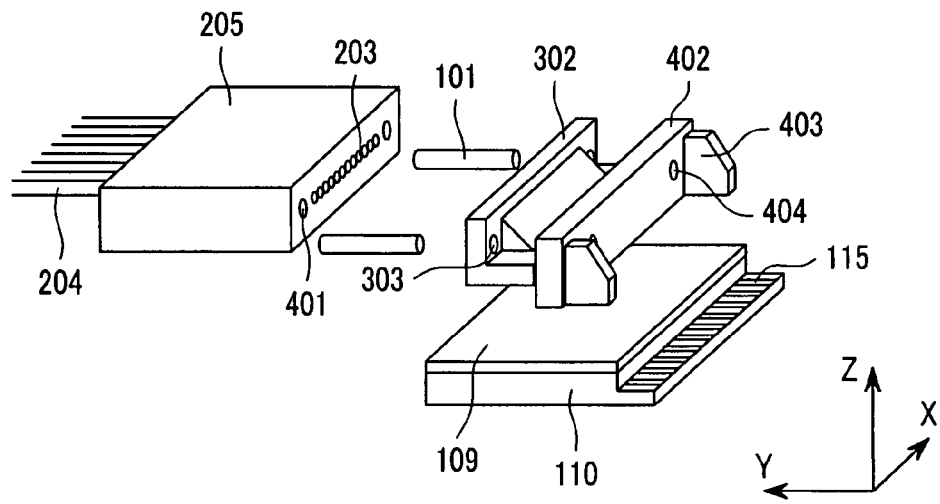
FIG. 4A is a perspective view illustrating a basic configuration of a multi-channel optical module according to a third embodiment of the present invention.
Figure 4B:
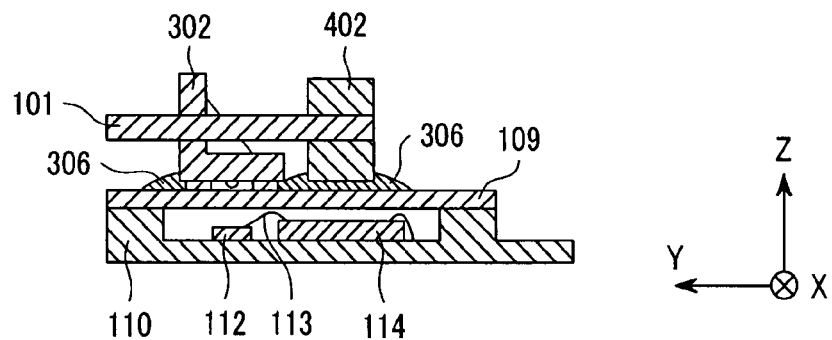
FIG. 4B is a cross-sectional view illustrating a basic configuration of the multi-channel optical module according to the third embodiment.
Figure 4C:
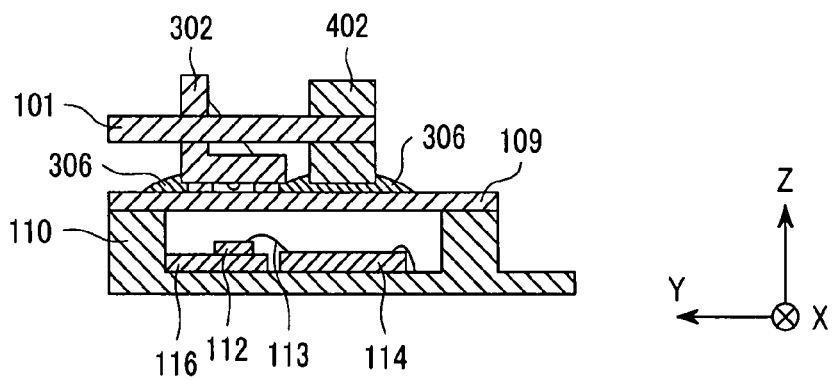
FIG. 4C is a cross-sectional view illustrating a basic configuration of the multi-channel optical module according to the third embodiment.

FIGS. 4A to 4C are a perspective view and cross-sectional views each illustrating a configuration of a third multi-channel optical module according to a third embodiment of the present invention. An optical connector 205 is inserted and pulled out during or after the manufacturing process of an optical module. A member 2-2 (402) is located on the negative side in the Y-axial direction of the lens plate 302 having the mirror. The member 2-2 (402) is, different from the member 2-1 (301), is not located between the lens plate 302 having the mirror and the optical connector 205 aligned externally. In this case, since a width of the member 2-2 (402) in the direction Y-axial direction can be set flexibly, there is the advantage that the member 2-2 (402) does not change the optical path length for an optical signal in use.

The member 2-2 (402) has a support component 403 so that the member 2-2 (402) can be fixed on the transparent plate 109 more stably. In a typical method for manufacturing an optical module illustrating in this example, the transparent plate 109 is sealed and fixed on the package 110. After the step, the lens plate 302 having the mirror is actively aligned with the optical element 112 and then is fixed on the transparent plate 109 using the resin 306. Then, the engagement pins 101 fixed on the member 2-2 (402) is aligned with the lens plate 302 having the mirror from the negative side in the Y-axial direction. In this method, the member 2-2 (402) is also firmly fixed on the transparent plate 109 using the resin 306.

The advantages in this example are as described below. The member 2-1 (301) is required to be processed in view of an optical length because the member 2-1 (301) is located between the lens plate 302 having the mirror and the external optical connector.

However, since the member 2-2 (402) does not change the optical length of an optical signal because of the size thereof, there is the advantage that a relatively large member can be used for increasing a retention strength of the engagement pins. Needless to say, there is no problem to use the member 2-1 (302) and the member 2-2 (402) together. In that case, there is the advantage that an accomplished multi-channel optical module has a high mechanical reliability and a high resistance against intrusion of foreign particles.

The optical element 112 can be approached more closely to a lens plane on the lens plate 302 by disposing the optical element 112 on a base 116. The base 116 may have the same body as the package 110, or may have a different body from the package 110. The advantages obtained by providing the base 116 are as follows:

1) A lens element of the lens plate 302 is approached more closely to the optical element 112 compared to an electric device by only heightening the optical element 112, so that the efficiency of optical coupling can increase.

2) When an electric element 114 is an active device such as IC, heat is generated. Specifically, when the optical element 112 is a light-emitting element, a temperature increases under the influence of the heat and characteristic properties of the optical element 112 may deteriorate. The optical element 112 is provided on the base and mounted on a different plane from the electric element 114, so that the heat can be prevented from flowing into the optical element 112.

Fourth Embodiment

Figure 5A:
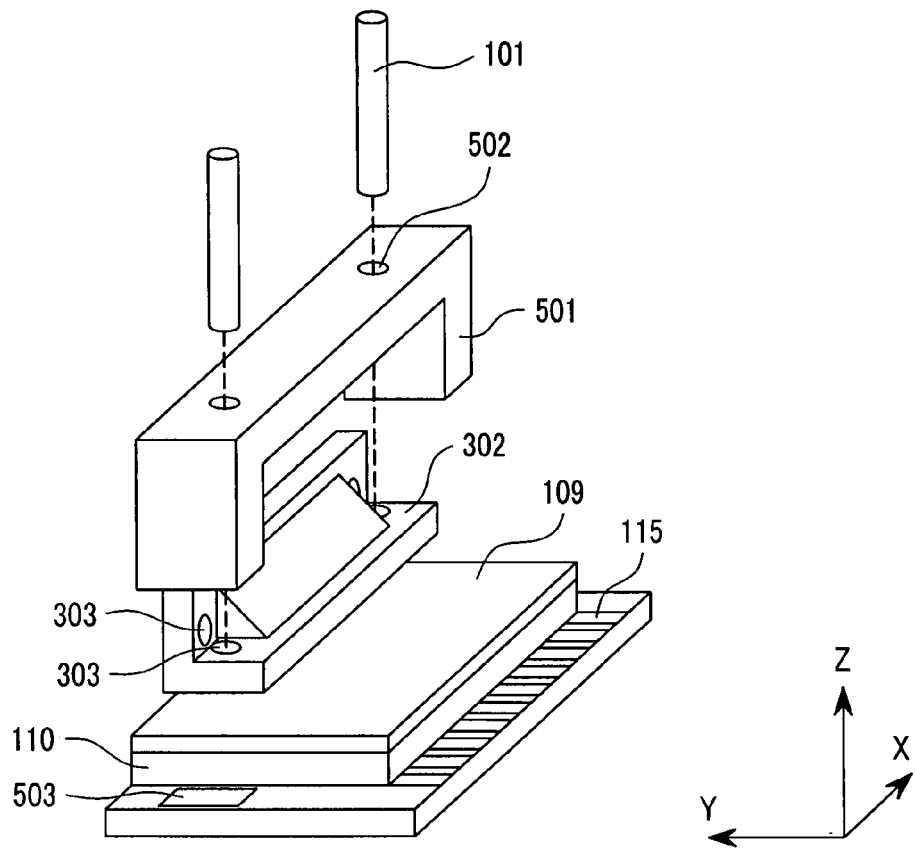
FIG. 5A is a perspective view illustrating a basic configuration of a multi-channel optical module according to a fourth embodiment of the present invention.
Figure 5B:
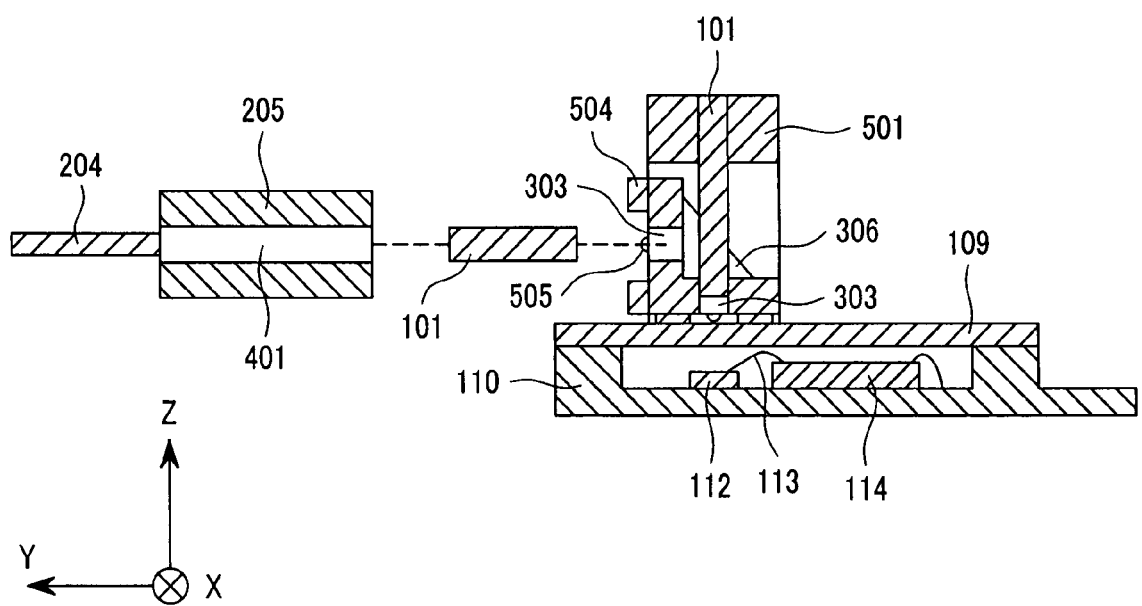
FIG. 5B is a cross-sectional view illustrating the basic configuration of the multi-channel optical module according to the fourth embodiment.

FIGS. 5A and 5B are respectively a perspective view and a cross-sectional view each illustrating a configuration of a fourth multi-channel optical module according to a fourth embodiment of the present invention. Engagement pin holes 502 provided on a member 3 (501) is positioned above the lens plate 302 having the mirror. The member 3 (501) is fixed to a third member mounting section 503 on a package 110. The engagement pins 101 are engaged with engagement pin holes 303 on the lens plate 302 with the mirror along the Z-axial positive direction, when the lens plate 302 with the mirror is fixed in the X- and Y-axial directions. The lens plate 302 with the mirror is fixed in the z-axial direction by fixing the engagement pins to the lens plate 302 having the mirror by using resin 306.

After an optical module is prepared, the external optical connector 205 is engaged and disengaged with the engagement pins 101 along the Y-axial positive direction. Convex sections 504 each function as a stopper for the external optical connector, and protects a lens element 505, and has a role of keeping a distance between the lens element 107 and the external optical connector 205 at a constant value. In a representative method of producing the optical module in the example, after the member 3 (501) is engaged with the lens plate with mirror 302 with the engagement pin 101, active alignment is performed to the optical element 112, and the member 3 (501) is fixed to the member mounting section 503. Finally, the engagement pins 101 substantially parallel to the Z-axial direction and the lens plate 302 with the mirror are fixed to each other by using resin 306.

It is needless to say that, in addition to the processes above, by preparing the same members, the fourth multi-channel optical module can be manufactured by performing active alignment once.

Fifth Embodiment

Figure 6:
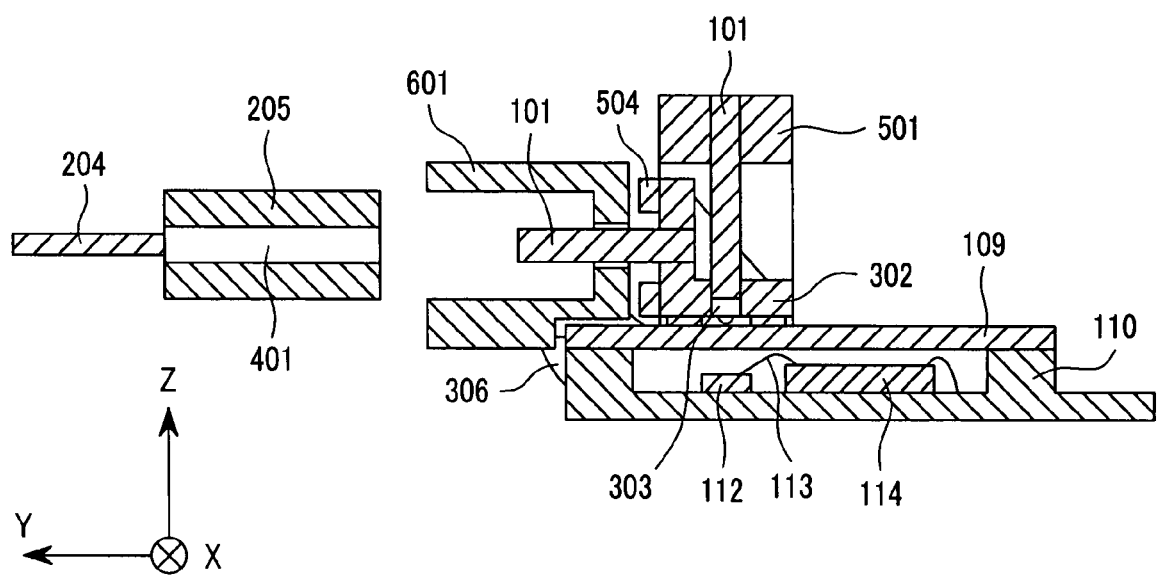
FIG. 6 is a cross-sectional view illustrating a basic configuration of a multi-channel optical module according to a fifth embodiment of the present invention.

FIG. 6 is a cross-sectional view illustrating a configuration of a fifth multi-channel optical module. By fixing a member 4-1 (601) to the package 110 with the resin 306, the lens plate with mirror 302 can be fixed in the X-, Y-, and Z-axial directions without applying the resin directly to the plate 302. When the optical connector is inserted from the outside, a pressure for insertion is applied mainly to the member 401 (601), and is not applied to the lens plate 302 having the mirror, which is advantageous.

The optical module as described above, in which the member 401 (601) or the lens plate 302 is not fixed to the transparent plate 109 with the resin 306 or the like, has the following advantages. Namely, the transparent plate 109 is thin, namely has the thickness of several hundreds μm, and even when an external force is applied to the lens plate 302, the transparent plate 109 is not broken. Although the resin 306 or the like extends and shrinks according to a temperature, but distortion is advantageously not applied to the transparent plate 109.

Sixth Embodiment

Figure 7:
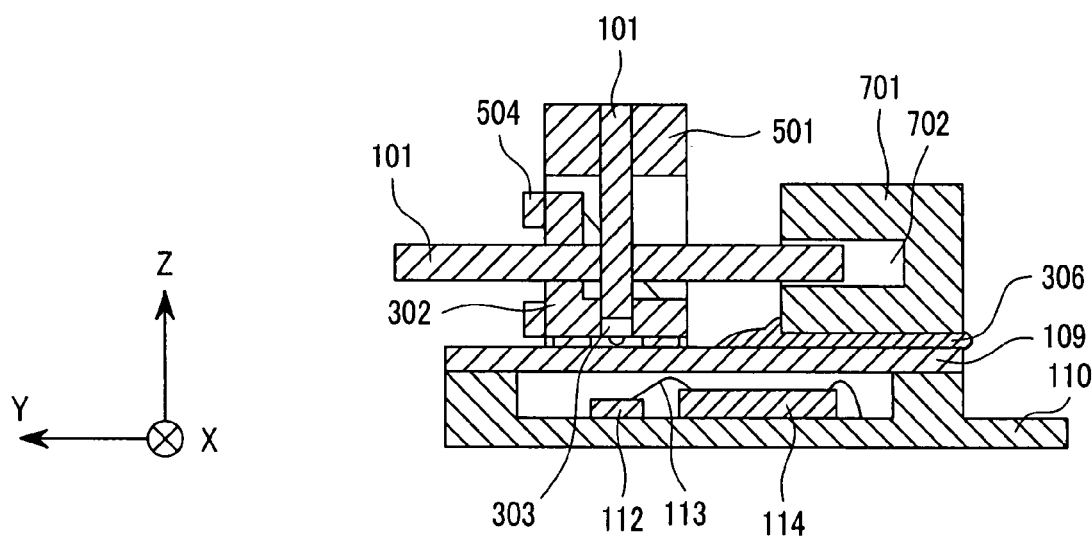
FIG. 7 is a cross-sectional view illustrating a basic configuration of a multi-channel optical module according to a sixth embodiment of the present invention.
Figure 8:
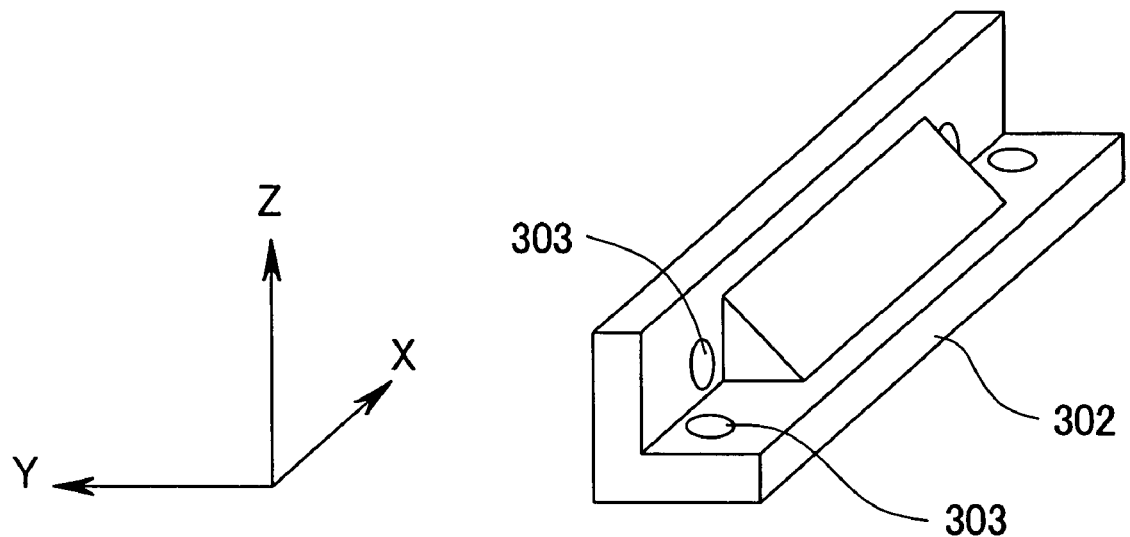
FIG. 8 is a perspective view illustrating a lens plate of the multi-channel optical module according to the sixth embodiment.

FIG. 7 is a cross-sectional view illustrating a configuration of a sixth multi-channel optical module according to a sixth embodiment of the present invention, and FIG. 8 illustrates an aspect of the lens plate used in this module. By fixing a member 4-2 (701) to the transparent plate 109 with the resin 306, the lens plate 302 having the mirror is fixed in the X-, Y-, and Z-axial directions without using the resin or the like. In the optical module, since two engagement pins 101 crosses other two engagement pins 101 at substantially right angles as shown in FIG. 8, the pins inserted in the Z-axial direction do not strike those inserted in the Y-axial direction in the engagement pin holes 303 as shown in FIG. 8.

Figure 10:
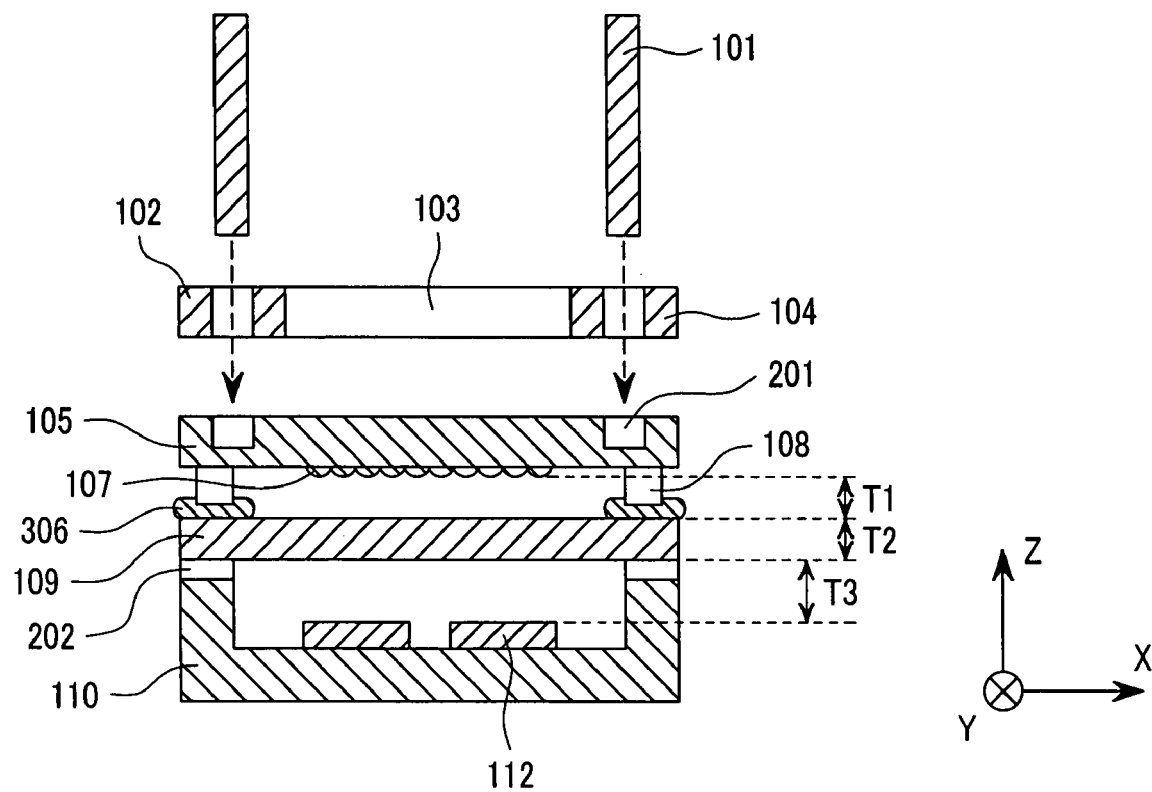
FIG. 10 is a cross-sectional view illustrating a basic structure of the multi-channel optical module according to the first embodiment.

FIG. 10 illustrates a state in which the multi-channel optical module is installed. In FIG. 10, T1 represent a distance between the lens element 107 and the transparent plate 109, T2 represent a thickness of the transparent plate 109, and T3 represent a distance between the optical element 112 and the transparent plate 109. The optical element 112 is a general arrayed light-emitting element in which light-emitting elements are arranged with a pitch of 250 μm, and it is assumed herein that the light-emitting angle is about 25 degrees. Furthermore it is assumed that a refraction index of the transparent plate 109 is about 1.5. Consider that a diameter of each element 107 is at max. 250 μm. The length of the optical path from the light-emitting element to the lens element is around 500 μm.

When the lens element 107 is arranged under the micro-lens array plate 105, assuming that a thickness of the lens plate 105 in the Z-axial direction is 150 μm (T1=T2=150 μm), an optical module having the high optical coupling capability can be formed.

Namely, by arranging at least a portion of the lens elements 107 such as various lens plates 105, 302, and like on the side facing the optical element 112, an optical path length between the lens elements 107 and the optical element 112 becomes shorter, which advantageously improves the optical coupling efficiency.

Figure 11:
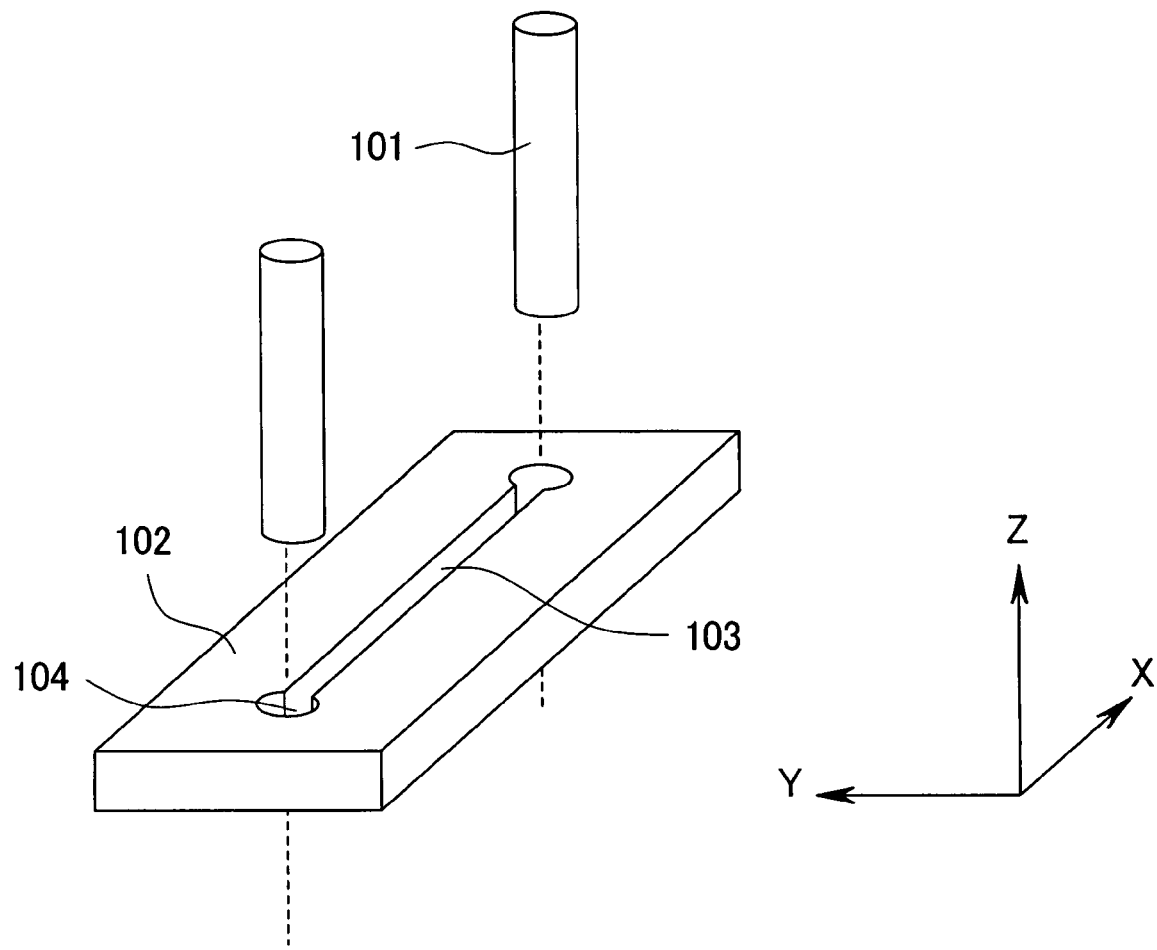
FIG. 11 is a perspective view illustrating a typical aspect of a section 1 used in the present invention.

FIG. 11 shows an example of the member 1 (102). Since the engagement pin holes 104 and a notched portion 103 through which an optical signal passes are provided on the member 1 in an integrated fashion, which makes it easier to mechanically machine the portion. In addition, since the width of the notched portion 103 in the Y-axial direction is narrower than a diameter of the engagement pin hole 104, when the engagement pins 101 are inserted into the engagement pin holes 104, the engagement pins 101 are strongly fixed in the X- and Y-axial directions.

When the engagement pins 101 fixed to the member 1 (102), the member 2-1 (301), and to the member 4-1 (601) are engaged with a general purpose MT connectors or MPO connected, a pitch between centers of the two engagement pins 101 is around 4.6 mm, and an optical signal pass through the section between the two engagement pins in the general configuration. On the other hand, when a multi-channel optical element is used as the optical element 112, an array device having 4, 8, or 12 light-emitting elements or light-receiving elements arrayed two-dimensionally are often used. Namely, the width of the optical element 112 is at maximum about 3 mm. When notched portions are provided in sections for passage of an optical signal in the members 1 (102), 2-1 (301), 4-1 (601), integrating the notched portion with the grooves in which the engagement pins are set in is advantageous for simplifying the manufacturing process. Especially, when the width of the notched portion is equal to or smaller than the diameter of the engagement pin 101, it is possible to fix the engagement pins by press-fitting the engagement pins to the members 1 (102), 2-1 (301), and 4-1 (601).

Seventh Embodiment

Figure 12:
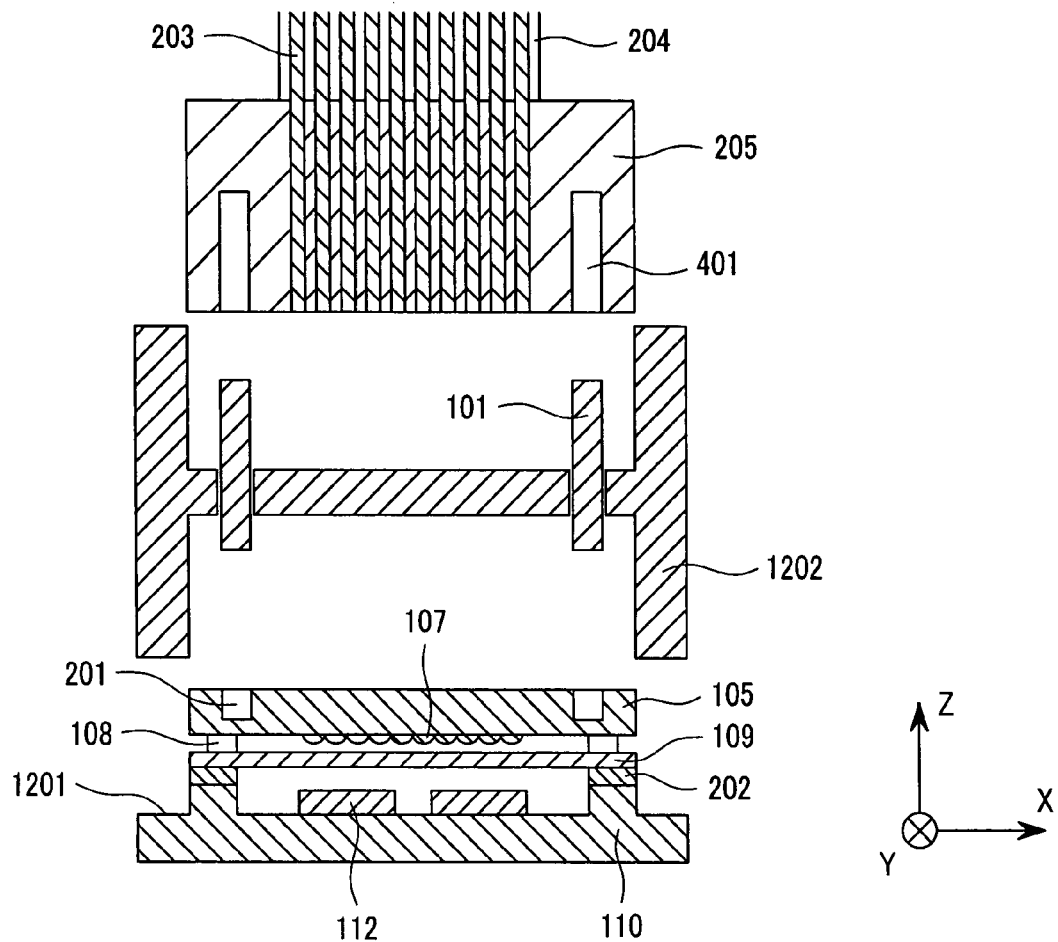
FIG. 12 is a cross-sectional view illustrating a basic structure of a multi-channel optical module according to a seventh embodiment of the present invention.

FIG. 12 is a cross-sectional view illustrating a packaged state of the optical module. The transparent member 1 (1202) is made of plastics for molding, and it is not necessary to provide a notched portion in the light passage. Furthermore, the transparent member 1 (1202) has an adaptor-like form, and the optical connector 205 can easily be inserted therein from the outside. Furthermore, since the transparent member 1 (1202) is mounted on a member-1 mounting section 1201 on the package, it is possible to prevent dust and other foreign material from coming into the micro-array plate 105, the transparent plate 109, and other related sections.

In other words, by using a transparent member for a portion of the member 1 (102) through which an optical signal passes, an opening or the like is not required in the portion through which an optical signal passes.

Furthermore, when an optical connector is inserted into a manufactured optical module, even if dusts or other foreign materials come in, the lens plate is protected by the transparent member. Thus, flaws or other damages are not easily generated in the optical module.

By preparing the member 1 (102) with a transparent plastic material, it is quite easy to perform machining for providing a portion through which an optical signal passes, a groove and a hole with which the engagement pin 101 is engaged, and other projections or grooves.

When a plastic material is used, a complicated structure can be made in batch by molding. For instance, it is possible to integrate an optical connector sleeve with the member 1 (102), and FIG. 12 illustrates the transparent member 1 (1202) in which the optical connector sleeve and the member 1 (1202) are integrated.

The advantages described above are also applicable to the members 2 and 4 described above.

Eighth Embodiment

Figure 13:
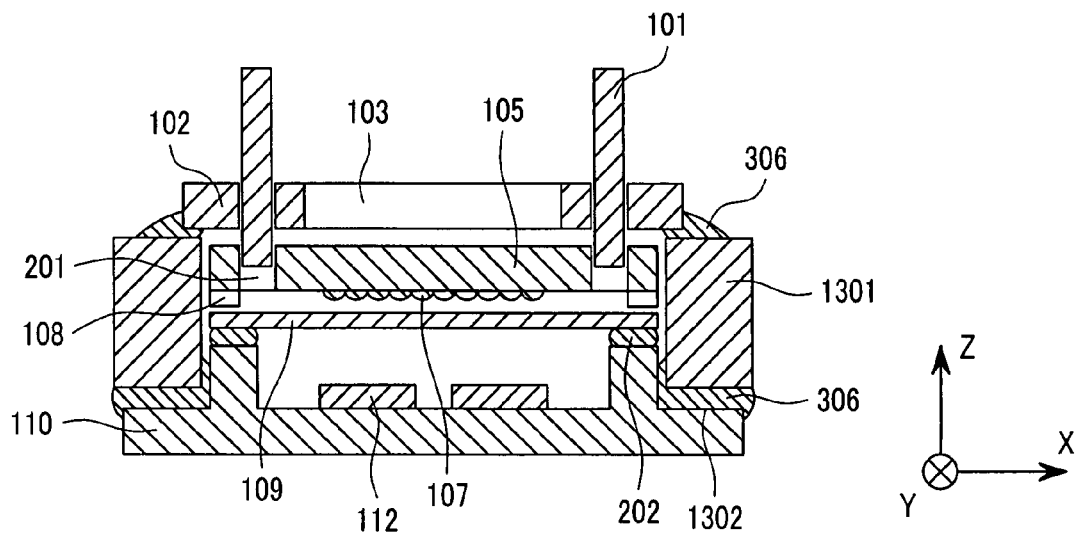
FIG. 13 is a cross-sectional view illustrating a basic structure of a multi-channel optical module according to an eighth embodiment of the present invention.

FIG. 13 is a cross-sectional view illustrating a packaged state of the optical module. A base 1301 is mounted on a base mounting section 1302 of the package 110 and is fixed by using the resin 306. The member 1 is mounted on the base 1301. Because of the configuration, the micro-lens array plate 105 is arranged in a space between the member 1 (102) and the transparent plate 109. Therefore, after the module is manufactured, when an external optical connector is engaged from the positive side in the Z-axial direction, an external stress is supported by the member 1 and the base 1301, and is not applied to the micro-lens array plate 105, which is advantageous. Since the optical element 112 is mounted on the package 110, the distance between the optical element 112 and the member 1 (102) in the Z-axial direction does not depend on a precision during a manufacturing process of the package 110 or the transparent plate 109, and can be controlled only by adjusting the base 1301. The base 1301 may be either integrated with or separated from the member 1 (102), and also may be integrated with or separated from the package 110. Either configuration can be selected according to the number of manufacturing steps and manufacturing cost. Furthermore, the micro-lens array plate 105 may adhere to the transparent plate 109 or to the member 1 (102).

Figure 14:
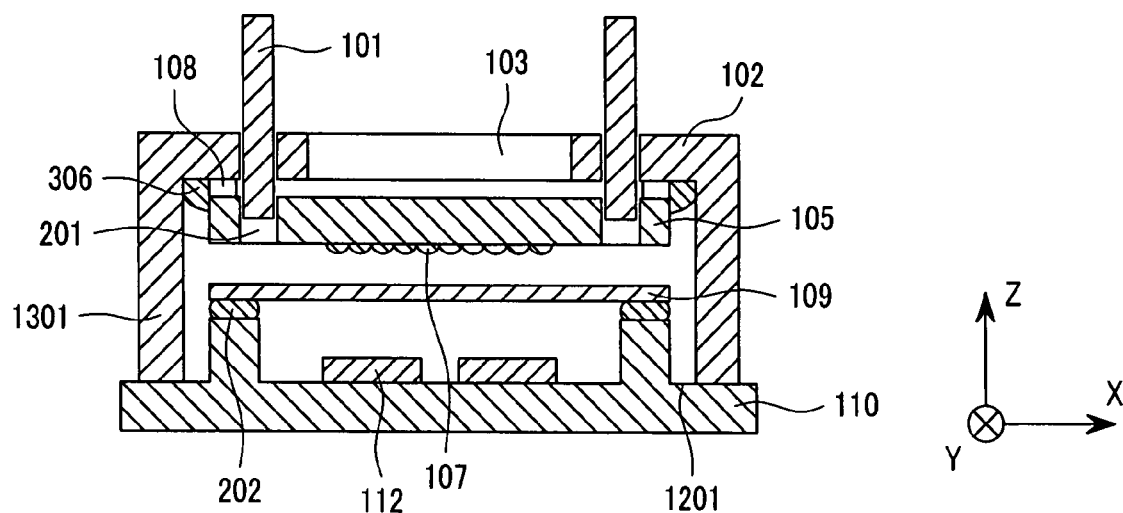
FIG. 14 is a cross-sectional view illustrating a basic structure of a multi-channel optical module according to the eighth embodiment.

FIG. 14 is a cross-sectional view illustrating a packaged state of the optical module. The base 1301 is integrated with and forms a portion of the member 1 (102). The micro-lens array plate 105 adheres to the member 102 with the resin 306. Because of the configuration, the lens elements 107 never collides with the transparent plate 109 or the like during or after the manufacturing process.

As described above, by providing a base at least at one place between the member 1 (102) and the package, and also making a distance between the member 1 (102) and the transparent plate 109 larger than a thickness of the micro-lens array plate 105, there is provided the effect that external pressure or the like applied to the member 1 (102) or the base 1301 is not directly applied to the micro-lens array plate 105.

Ninth Embodiment

Figure 15:
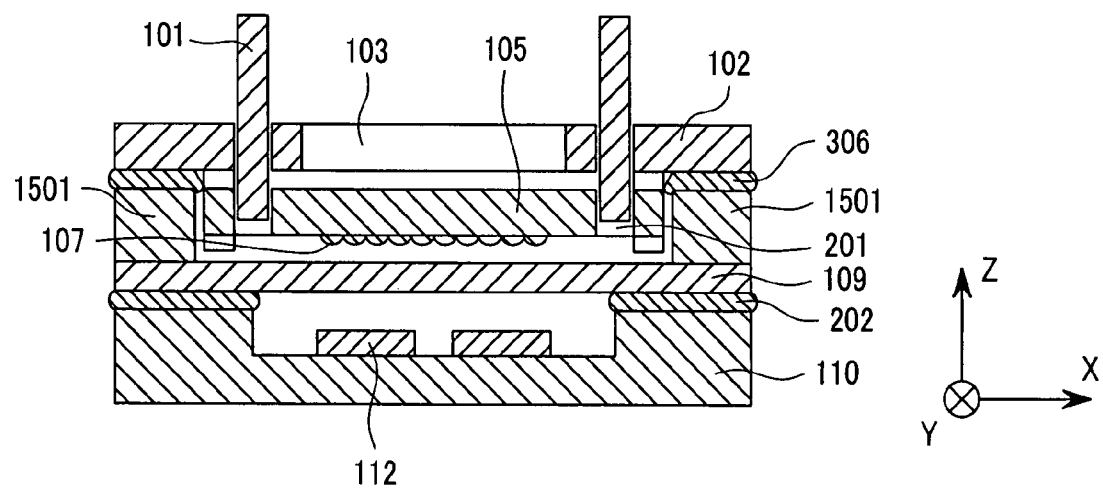
FIG. 15 is a cross-sectional view illustrating a basic structure of a multi-channel optical module according to a ninth embodiment of the present invention.

FIG. 15 is a cross-sectional view illustrating a packaged state of the optical module. A base 1501 is fixed to a transparent plate 109. The member 1 (102) is fixed to the base 1501 with the resin 306. Since the thickness of the base 1501 is larger than that of the micro-lens array plate 105, the micro-lens array plate 105 is arranged between the member 1 (102) and the transparent plate 109. The base 1501 may be integrated with or separated from the member 1 (102).

As described above, since at least one base is provided between the member 1 (102) and the transparent plate 109, and a distance between the member 1 (102) and the transparent plate 109 is larger than the thickness of the micro-lens array plate 105, there is provided the effect that external pressure or the like applied to the member 1 (102) or the base 1301 is not directly applied to the micro-lens array plate 105.

Tenth Embodiment

Figure 16:
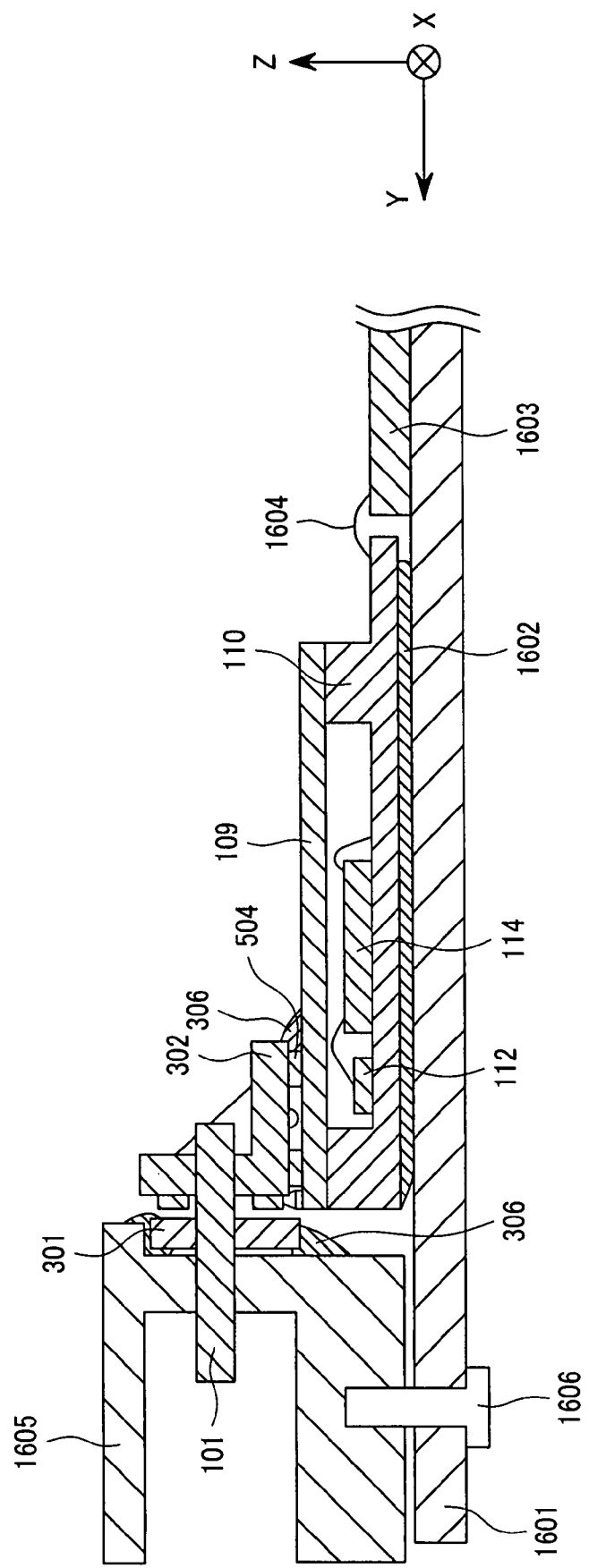
FIG. 16 is a cross-sectional view illustrating a basic structure of a multi-channel optical module according to a tenth embodiment of the present invention.

FIG. 16 is a cross-sectional view illustrating a packaged state of the optical module. The package 110 is fixed to an optical module plate 1601 with thermally-conductive resin 1602. Namely, heat or other energy emitted from the optical element 112 or the electrical element 114 are efficiently transmitted to the optical module plate 1601 and are released to the outside. An electric wiring pattern on a printed circuit board 1603 is connected via a wire 1604 to an electric wiring pattern on the package 110. A lens plate 302 having the mirror is mounted on and fixed to the transparent plate 109 with the resin 306. Although a convex section 504 is provided to the surface of the lens plate 302 having the mirror and mounted on the transparent plate 109 by use of the resin 306, the transparent resin 305 fills the space between the lens plate with mirror 302 and the transparent plate 109 due to the surface tension, which prevents the resin from flowing onto the lens elements 107.

The member 2-1 (301) is made of a transparent member, and is attached to an optical adaptor 1605. A portion of the optical connector/adaptor 1605 through which an optical signal passes has a notched section provided therein or is made of a transparent material. The optical adaptor/connector 1605 and the member 2-1 (301) may be separated from or integrated with each other. The optical connector/adaptor 1605 is attached to the optical module plate 1601 with a screw 1606. Because of the configuration, when the optical connector is inserted into the optical connector/adaptor 1605 from the outside, pressure applied by the insertion is applied to the optical module plate 1601, which prevents the pressure from being applied to the lens plate 302 having the mirror.

Eleventh Embodiment

Figure 17:
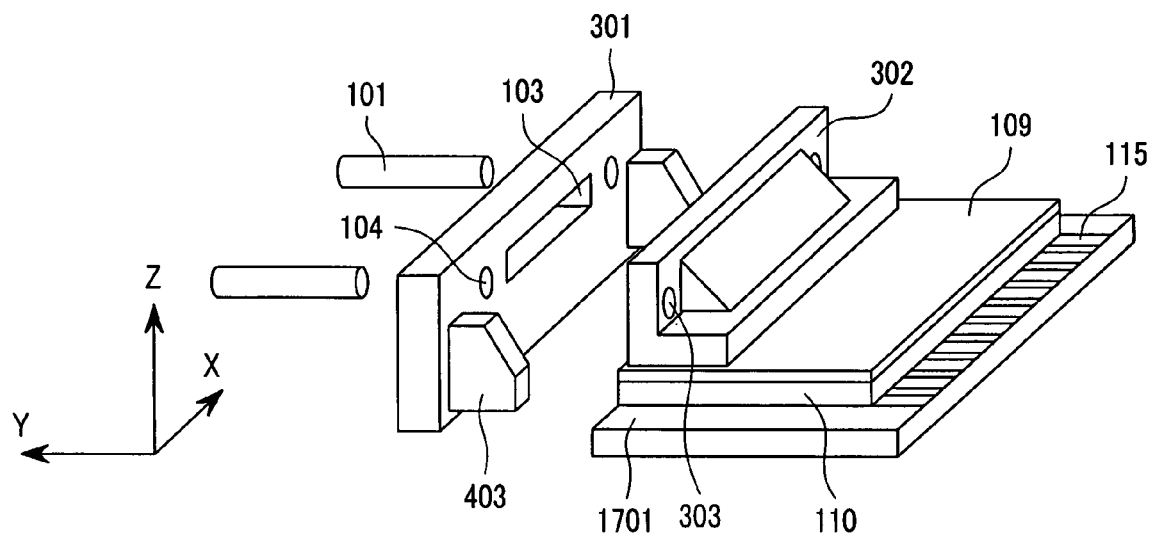
FIG. 17 is a perspective view illustrating a basic structure of a multi-channel optical module according to an eleventh embodiment of the present invention.

FIG. 17 is a perspective view illustrating a packaged state of the optical module. A support member 403 is attached to the member 2-1 (301), and the support member 403 is fixed to a member-2 mounting section 1701. The transparent member 109 is generally thin (with the thickness of several hundreds am). When an external force or the like is added during or after the manufacturing process, the transparent plate 109 is easily broken. Therefore, as shown in FIG. 17, when the member 2-1 (301) is attached not to the transparent plate 109, but to the package 110, the strength is advantageously enhanced.

Figure 18:
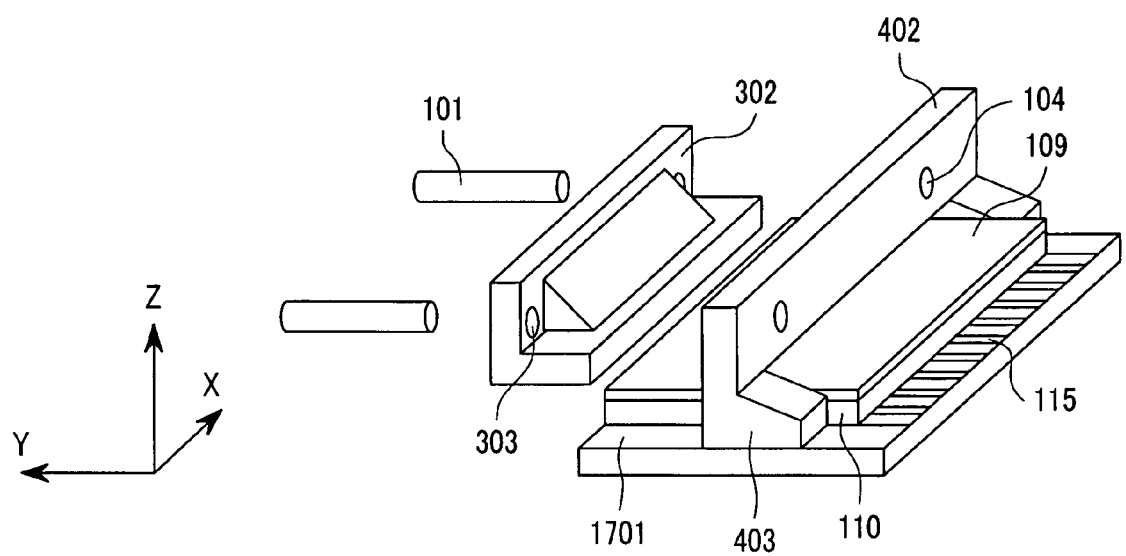
FIG. 18 is a perspective view illustrating a basic structure of a multi-channel optical module according to the eleventh embodiment.

FIG. 18 is a perspective view illustrating a packaged state of the optical module. Because the member 202 (402) is fixed via a support member 403 to the package 110, the strength is advantageously enhanced. Furthermore, since the member 2-2 (402) is not on the axis on which an optical signal passes, there is provided the effect that the thickness in the Y-axial direction can be set at a desired value to enhance the engagement strength of the engagement pin 101.

Twelfth Embodiment

Figure 19A:
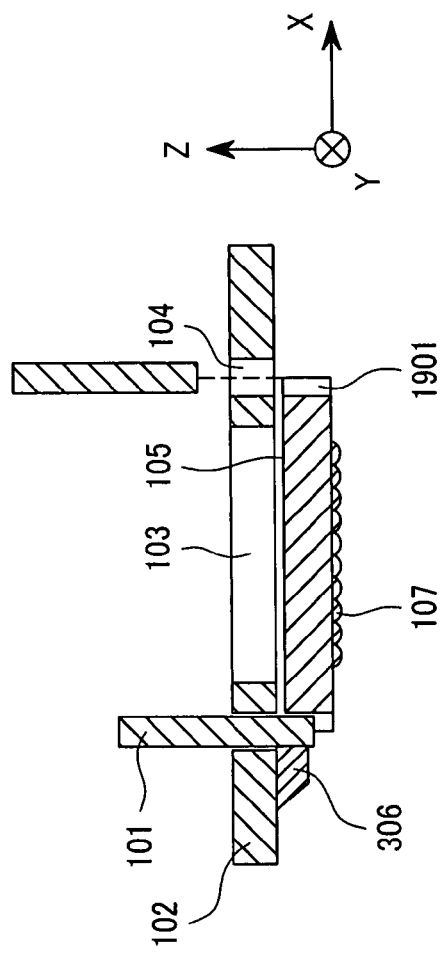
FIG. 19A is a cross-sectional view illustrating a member 1, a micro-lens array plate, and engagement pins implemented in a multi-channel optical module according to a twelfth embodiment of the present invention.
Figure 19B:
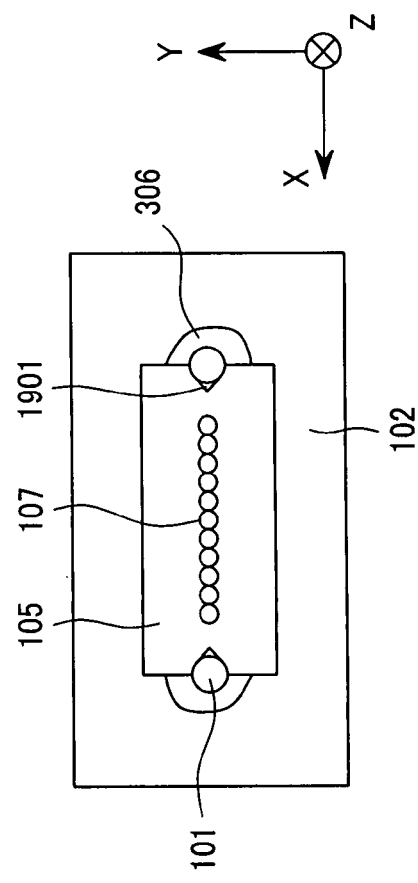
FIG. 19B is a top view illustrating the member 1, the micro-lens array plate, and the engagement pins implemented in the multi-channel optical module according to the twelfth embodiment.
Figure 19C:
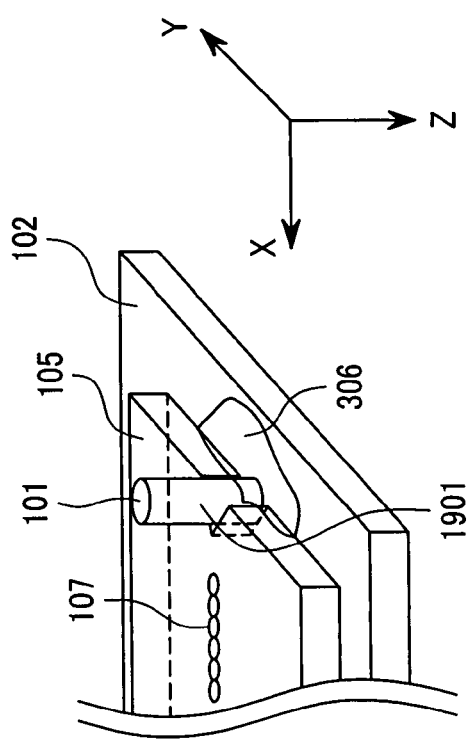
FIG. 19C is a perspective view illustrating the member 1, the micro-lens array plate, and the engagement pins implemented in the multi-channel optical module according to the twelfth embodiment.

FIGS. 19A to 19C are views each illustrating a state in which the micro-lens array plate 105, the engagement pins 101, and the member 1 (102) are fixed to each other. The micro-lens array 105 is substantially fixed in the X- and Y-axial directions by setting the engagement pins 101 in the engagement pin holes 104 formed in the member 102 and engagement pin grooves 1901 provided in the micro-lens array plate 105. Because the engagement pin grooves are not formed into a hole shape, only pouring the resin 305 into the engagement pin grooves 1901 makes it possible to easily fix the micro-lens array plate 105, the member 1 (102), and the engagement pins 101 to each other.

Figure 20:
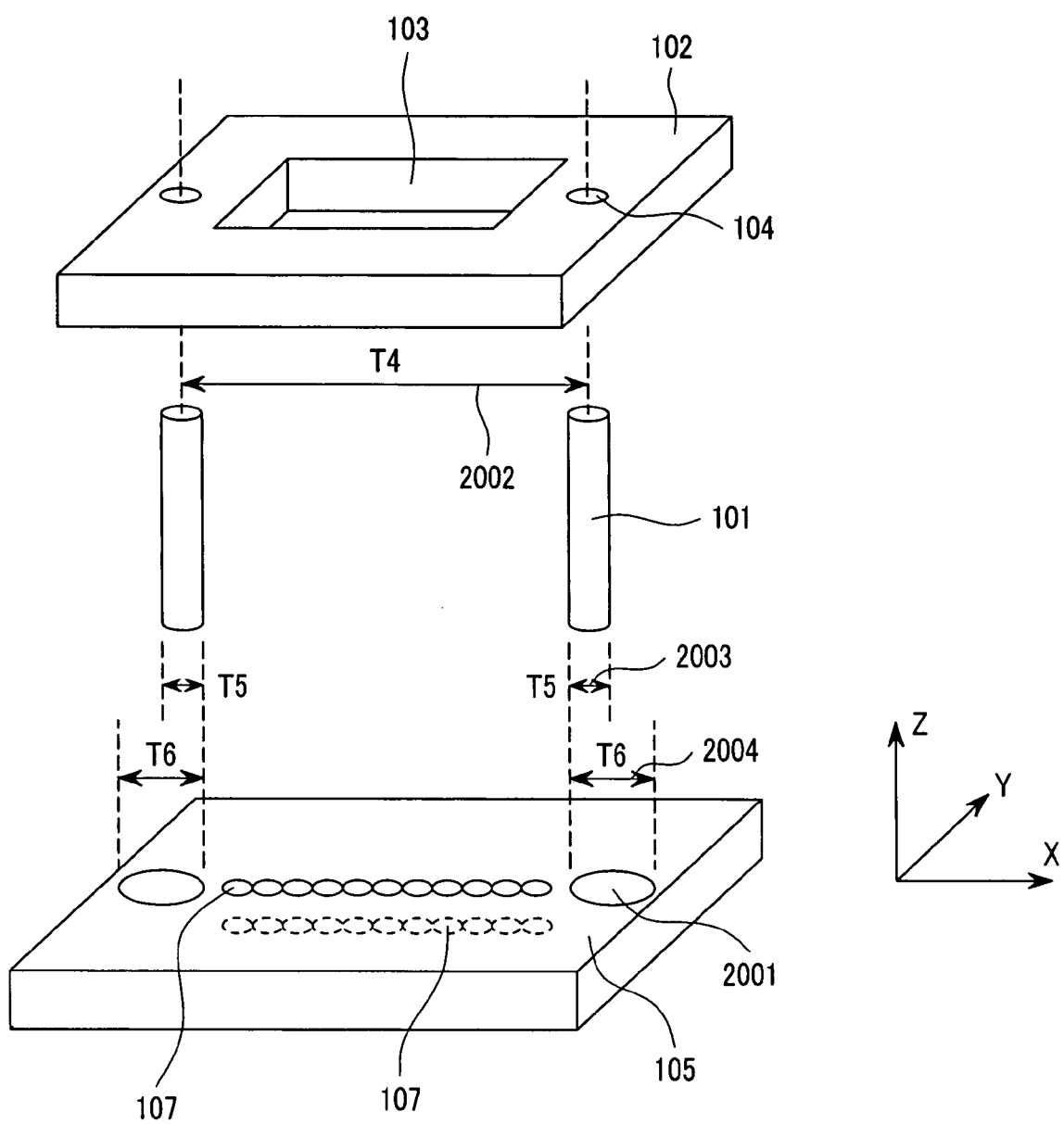
FIG. 20 is a perspective view illustrating the member 1, the micro-lens array plate, and the engagement pins implemented in the multi-channel optical module of the present invention.

FIG. 20 is a view showing a state in which the engagement pins 101 are engaged with the engagement pin holes 104 formed in the member 1 (102) and long engagement pin holes 2001 formed in the micro-lens array plate 105. The lens element 107 is provided on a main surface of the micro-lens array 105. A distance T4 (2002) between centers of the engagement pins is about 4.6 mm in the case of using an ordinary MT connecter or an MPO connector, and the engagement pin holes 2001 are provided in the micro-lens array plate 105 so that the distance T4 is maintained. A clearance width (T6-T5) in the X-axial direction generated when the engagement pin 101 is engaged with the long hole 2001 is sufficient to pour resin for fixing. The configuration as described above provides the effect that, the resin is inserted in the long holes 2001 so that each of the engagement pins 101, micro-lens array plate 105, the member 1 (102) are easily fixed to each other.

Figure 21:
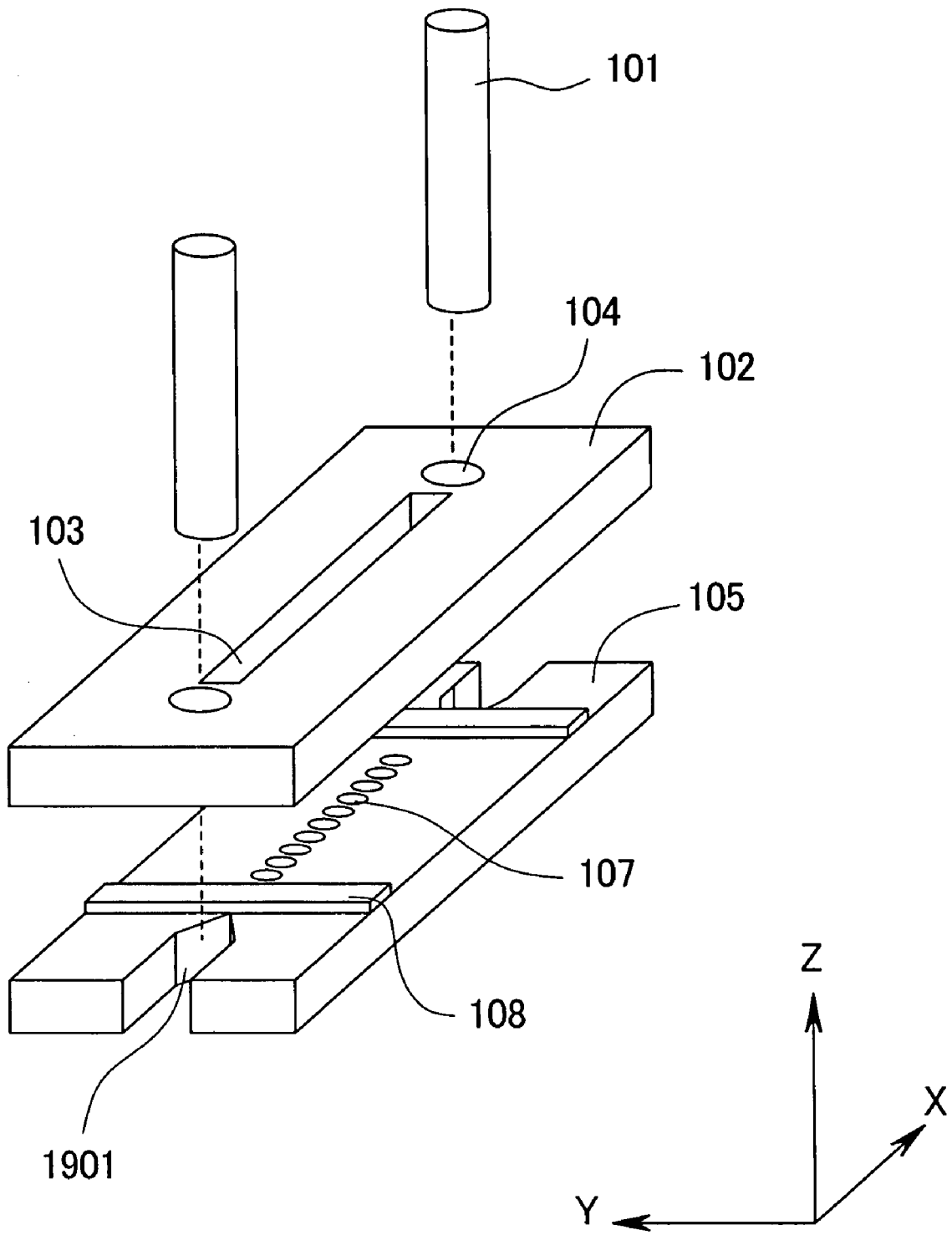
FIG. 21 is a perspective view illustrating the member 1, the micro-lens array plate, and the engagement pins implemented in the multi-channel optical module of the present invention.

FIG. 21 illustrates engagement of the micro-lens array plate 105, the engagement pins 101, and member 1 (102). When the components are fixed, it is required only to perform engagement with the engagement pins 101 and insert the resin into engagement pin grooves 1901 for fixing the components. The convex section 108 has a function to prevent resin from flowing into the lens element 107 after the insertion of the resin.

Figure 22:
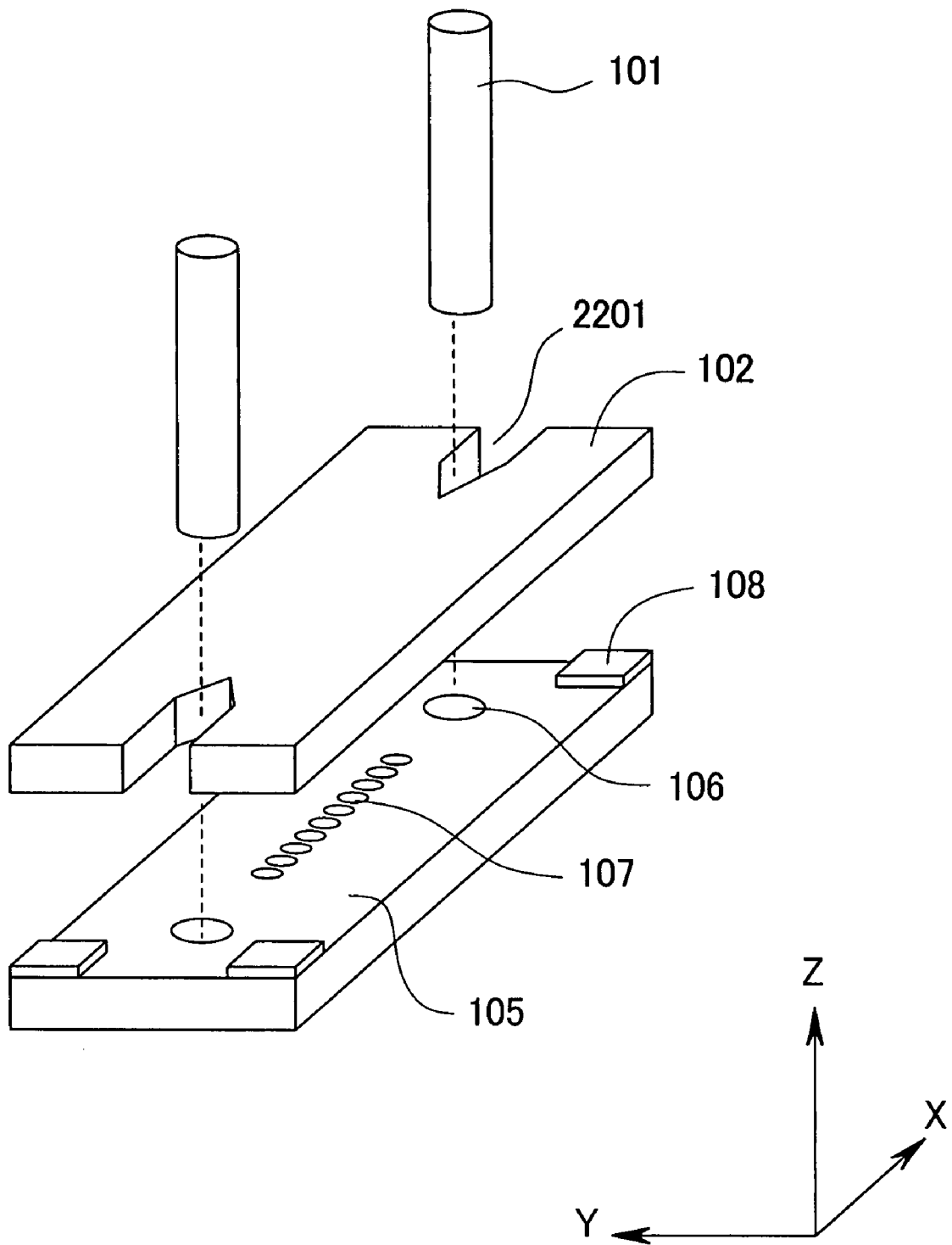
FIG. 22 is a perspective view illustrating the member 1, the micro-lens array plate, and the engagement pins implemented in the multi-channel optical module of the present invention.

FIG. 22 is a view illustrating engagement of the micro-lens array plate 105, the engagement pins 101, and the transparent member 1 (102). When the component are to be fixed, at first the components are assembled, and then peripheries of engagement pin grooves 2201 provided in the member 1 (102) is required to be fixed with resin.

Figure 23A:
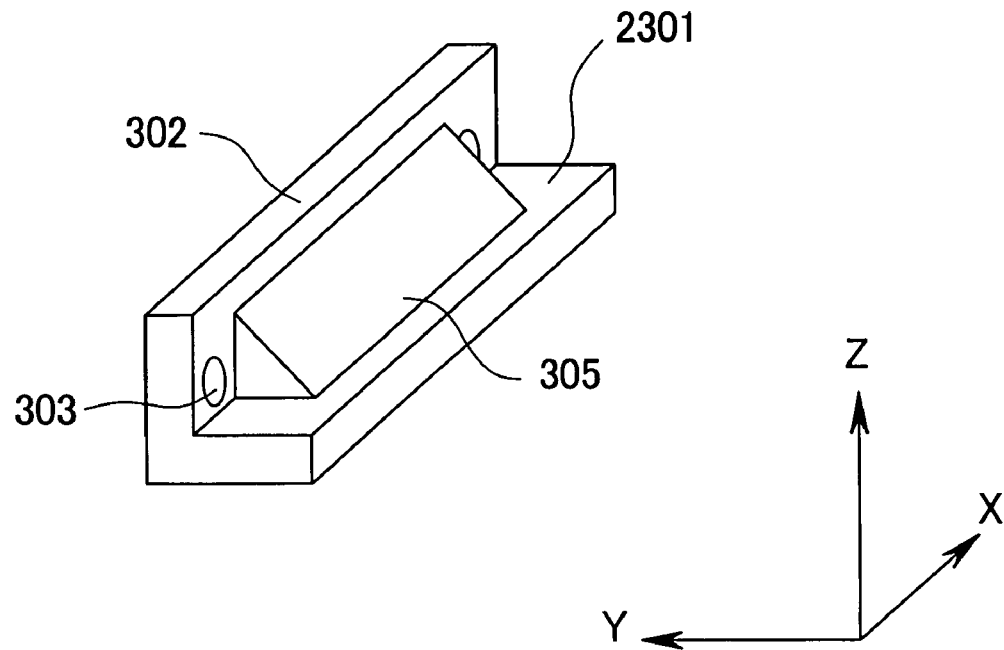
FIG. 23A is a perspective view illustrating an aspect of a flat lens plate including a mirror used in the multi-channel optical module of the present invention.
Figure 23B:
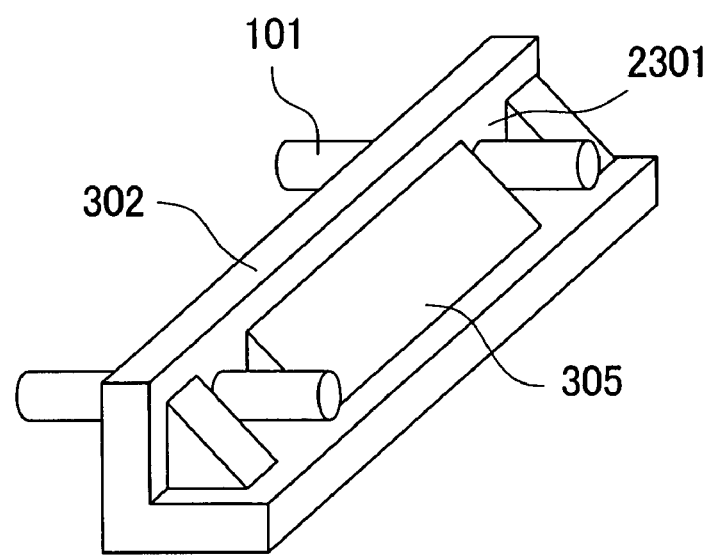
FIG. 23B is a perspective view illustrating an aspect of a flat lens plate including a mirror used in the multi-channel optical module of the present invention.

FIGS. 23A and 23B each illustrate the lens plate 302 having the mirror. When the lens plate 302 having the mirror and the engagement pins 1 are fixed to each other with resin, it is necessary to prevent the resin from flowing onto a mirror surface 305. Because a groove 2301 for fixing is provided, the resin for fixing does not spread over the mirror surface 305 and resides in the groove 2301 for fixing. Therefore, a contact area between the resin for fixing and the engagement pin 101 increases, the strength for engagement advantageously increases.

Figure 24:
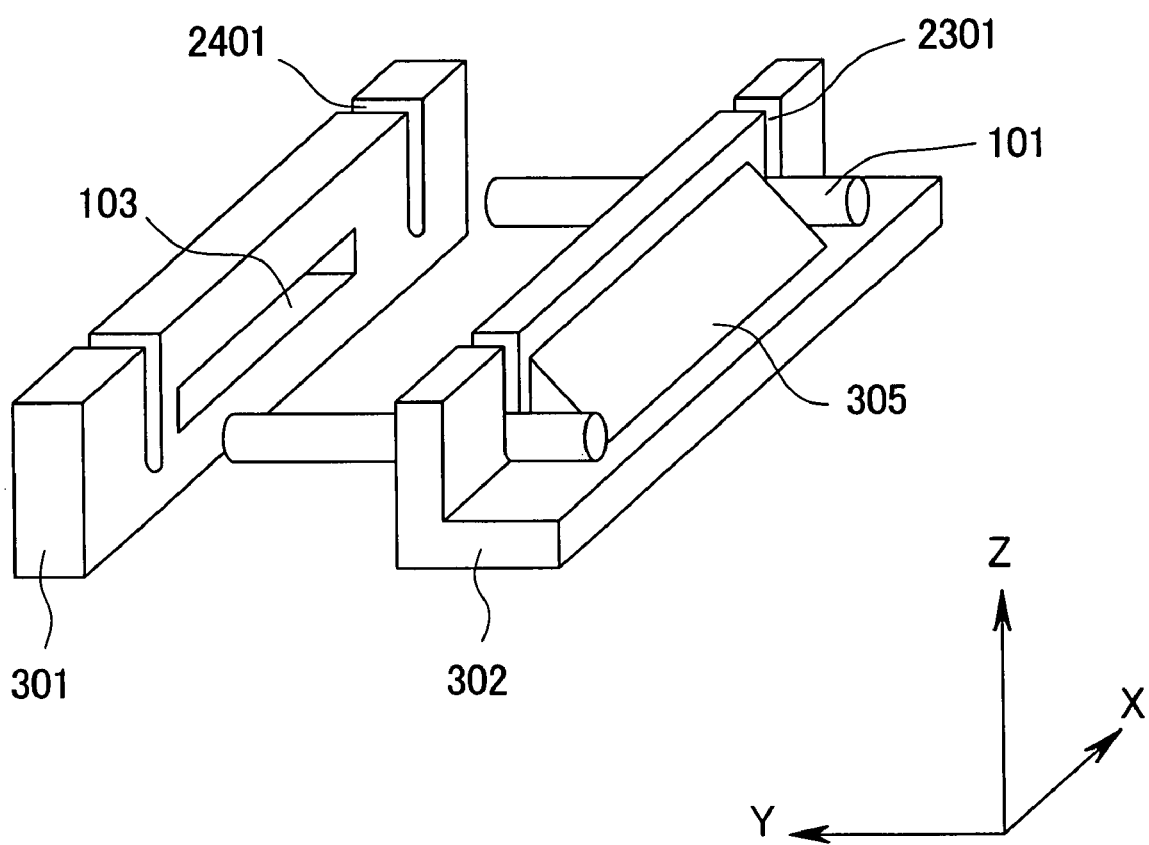
FIG. 24 is a perspective view illustrating an aspect of a member 2, a flat lens plate including a mirror, and engagement pins used in the multi-channel optical module of the present invention.

FIG. 24 illustrates a packaged state of the lens plate 302 having the mirror and a member 2-1 (301). The engagement pins can be inserted from the positive side in the Z-axial direction by using grooves for fixing 2301, 2401. Furthermore, the resin 306 is inserted into the grooves for fixing 2301, 2401 so that the engagement pins 101, the member 2-11 (301), and the lens plate 302 having the mirror can easily be fixed to each other and are set tightly.

When the engagement pin 101 and the member 1 (102), or the engagement pin 101 and the micro-lens array plate 105 are fixed to each other, a portion of a groove or a hole which is used to engage the member 1 (102), the micro-lens array plate 105, and the engagement pin 101 with each other is made larger than a diameter of the engagement pin 101, This makes it easier to insert the resin into clearances among the engagement pin 101, the member 1 (102), and the micro-lens array plate 105, which advantageously enhances the strength in adhesion.

Thirteenth Embodiment

Figure 25:
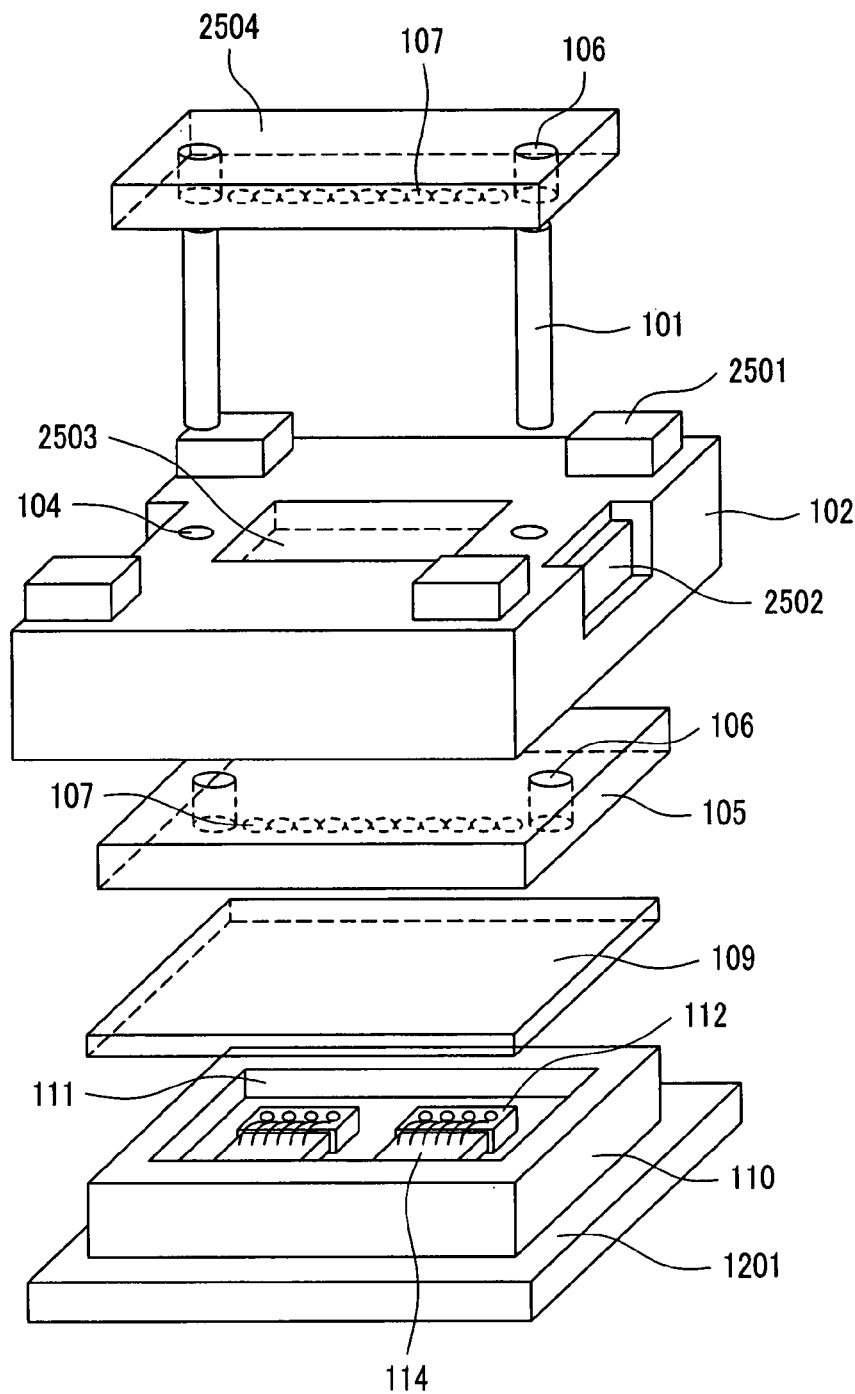
FIG. 25 is a cross-sectional view illustrating a basic structure of a multi-channel optical module according to a thirteenth embodiment of the present invention.

FIG. 25 is a perspective view illustrating a packaged state of the optical module. The member 1 (102) has a transparent portion 2503 through which an optical signal passes. The height of a base 2501 in the Z-axial direction is larger than the thickness of a second micro-lens array plate 2504. Since the base 2501 receives the optical connector (205) inserted from the outside, an external force is prevented from being applied to the second micro-lens array plate 2504. The member 1 (102) is mounted on the member-1 mounting section 1201 on the package 110. Because a hole 2502 is provided, a portion surrounded by the member 1 (102) and the package 110 is not sealed, and gas generated from the resin or the like goes out. Then, the second micro-lens array plate 2504 is mounted from above the member 1 (102).

That is, the structure shown in FIG. 25 is a two-lens system, and generally it is possible to make light beams passing through the two lenses similar to a collimated light beam in the two-lens system. In other words, the thickness of the member 1 (102) held between the two micro-lens array plates 105, 2504 can be made larger, which advantageously enhances the holding strength and the mechanical reliability of the engagement pins 101.

Furthermore, an optical fiber held by an external optical connector and the second micro-lens array plate are placed at positions close to each other. Because of the configuration, for instance, when an optical receiver is configured, even if an optical signal spreading at an angle comes out from the optical fiber held by the external optical fiber, the optical signal can be propagated without any loss.

Fourteenth Embodiment

Figure 26:
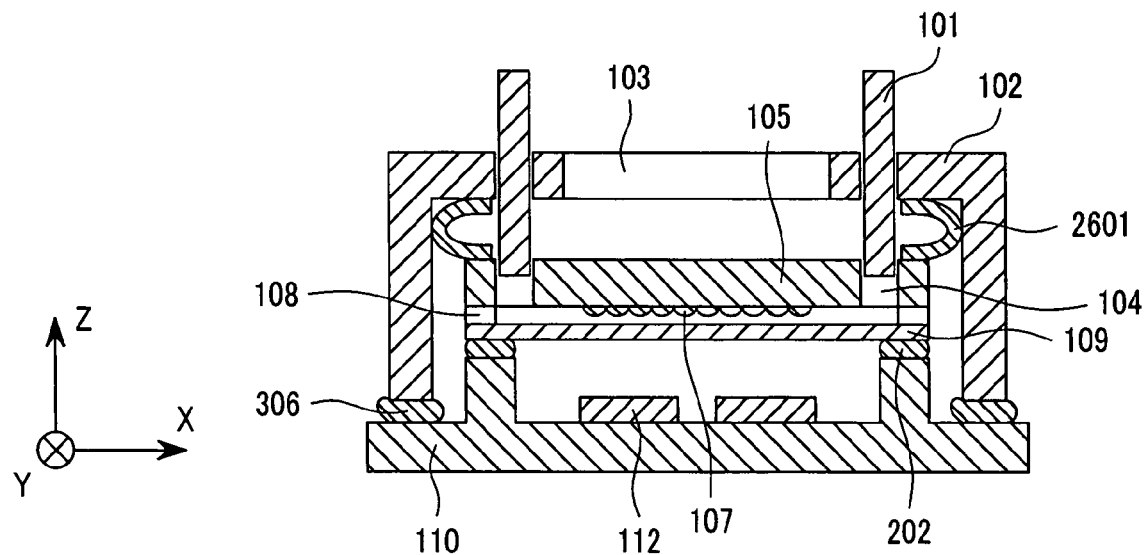
FIG. 26 is a cross-sectional view illustrating a basic structure of a multi-channel optical module according to a fourteenth embodiment of the present invention.

FIG. 26 is a cross-sectional view illustrating a packaged state of the optical module. The engagement pins 101 are fixed to the member 1 (102), and are not fixed to the micro-lens array plate 105 although portions of the engagement pins 101 are inserted into the engagement holes 104. When the member 1 (102) is fixed to the package 110 with the resin 306, the micro-lens array plate 105 is fixed in the X- and Y-axial directions. The micro-lens array plate 105 is fixed in the Z-axial direction, because an elastic body 2601 presses the micro-lens array plate 105 toward the transparent plate 109. That is, the micro-lens array plate 105 can be fixed to the transparent plate 109 without using resin or the like.

Figure 27:
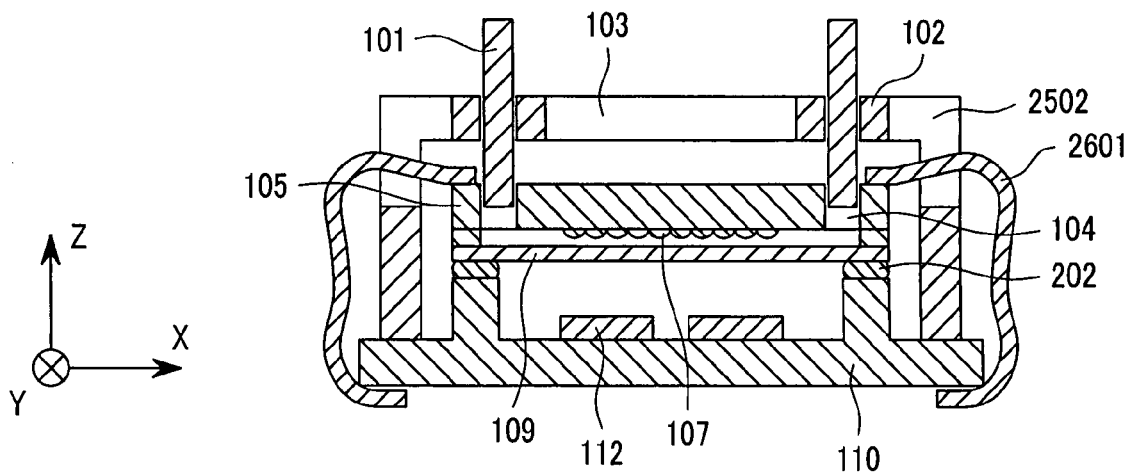
FIG. 27 is a cross-sectional view illustrating a basic structure of the multi-channel optical module according to the fourteenth embodiment.

FIG. 27 is a cross-sectional view illustrating a packaged state of the optical module. Because holes 2502 are provided in the member 1 (102), a portion of the elastic body 2601 for pressing the micro-lens array plate 105 toward the transparent plate 109 can be provided outside the member 1 (102). In this configuration, an end of the elastic body 2601 is fixed to the package 110.

In the optical module using the member 1 (102), by inserting the engagement pins 101 into the micro-lens array plate 105 to press a portion of the micro-lens array plate 105 toward the transparent plate 109, the micro-lens array plate 105 can be fixed in the X-, Y- and Z-axial directions without fixing the micro-lens array plate 105 by using any adhesive material.

After the micro-lens array plate 105, the transparent plate 109, and the member 1 (102) are amounted on the package 110, if the micro-lens array plate 105 is exposed to the outside, the elastic body for pressing the micro-lens array plate 105 can be provided at any position in the optical module.

Fifteenth Embodiment

Figure 28:
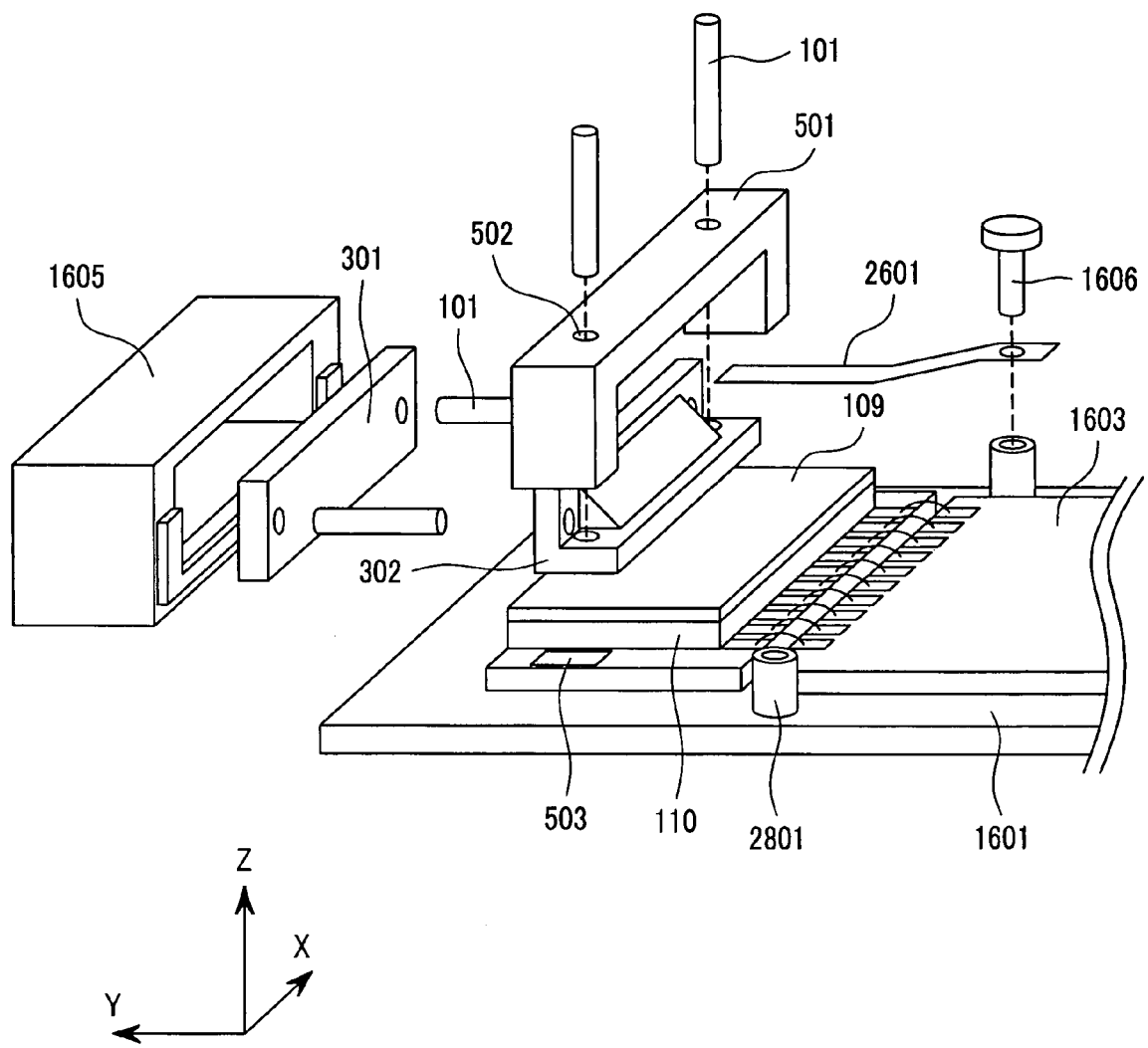
FIG. 28 is a perspective view illustrating a basic structure of a multi-channel optical module according to a fifteenth embodiment of the present invention.
Figure 29:
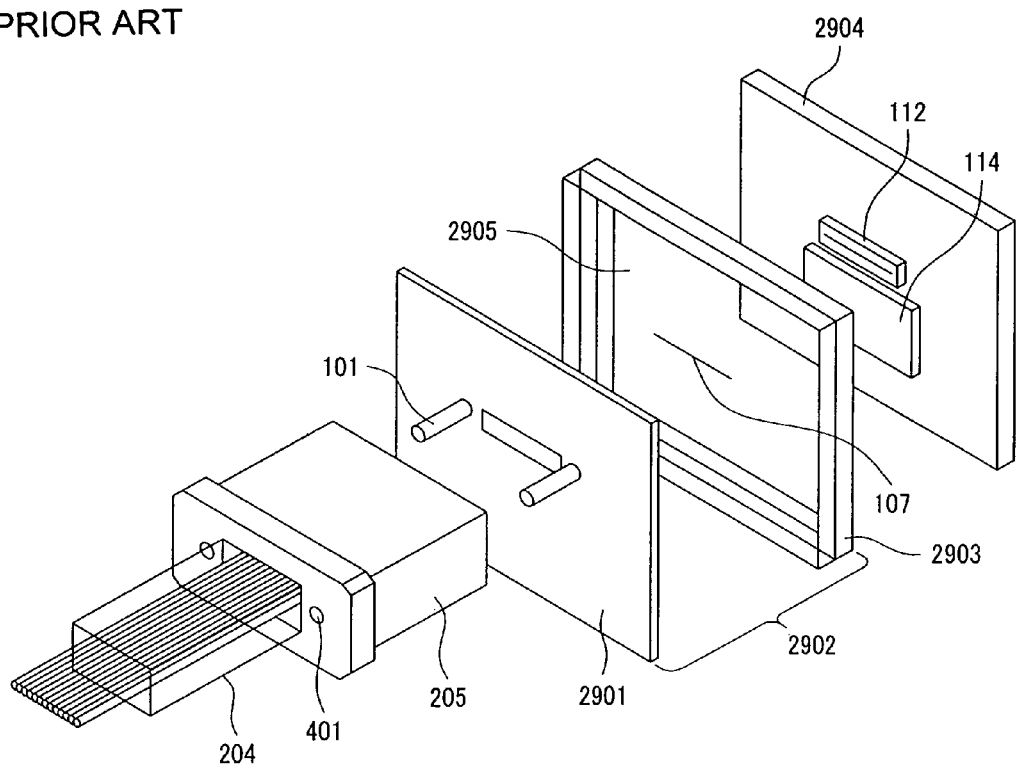
FIG. 29 is a perspective view illustrating a structure of a conventional multi-channel optical module.

FIG. 28 is a perspective view illustrating a packaged state of the micro-lens array plate 105. The package 110 and a printed circuit board 1603 are mounted on a module plate 1601. The lens plate 302 having the mirror is fixed in the X- and Y-axial directions by inserting the engagement pins 101 fixed to a member 3 (501). An elastic body 2601 is fixed to the module plate 1601 by using a screw insertion section 2801 and a screw 1606, and the lens plate 302 having the mirror is pressed to the transparent plate 109.

Because of the configuration as described above, the lens plate 302 having the mirror is fixed in the X-, Y-, and Z-axial directions without using resin or the like. The member 2-1 (301) is made of a transparent material, and is engaged with the lens plate 302 having the mirror from the positive side in the Y-axial direction by using the engagement pins 101. The member 2-1 (301) may be fixed to an optical connector adapter 1605, and the optical connector adaptor can be fixed to a portion of the optical module, for instance, to the module plate 1601 or the like. In this case, even when an optical connector is inserted from the outside, the external pressure is not applied to the optical system including the lens plate 302 having the mirror, which provides the effect that mechanical reliability of the optical module can be improved.

Reference numerals used in the drawing are described below.
101: Engagement pin
102: Member 1
103: Notched portion
104: Engagement pin hole
105: Micro-lens array plate
106: Engagement pin hole
107: Lens element
108: Convex portion
109: Transparent plate
110: Package
111: Concave portion
112: Optical element
112: Wire
114: Electrical element
115: Electric wiring pattern
116: Base
201: Engagement pin groove
202: Fixing material for sealing
203: Optical fiber
204: Optical fiber cable
205: Optical connector
206: Lid section
301: Member 2-1
302: Lens plate with mirror
303: Engagement pin hole
304: Lens element
305: Mirror surface
306: Resin
401: Engagement pin hole
402: Member 2-2
403: Support material
501: Member 3
502: Engagement pin hole
503: Member-3 mounting section
504: Convex section
505: Lens element
601: Member 4-1
701: Member 4-2
702: Engagement pin hole
901: Upper mold
902: Hole
903: Column for engagement pin
904: Groove for lens
905: Lower mold
906: Lens material
907: Pouring port
1201: Member-1 mounting section
1202: Transparent member 1
1301: Base
1302: Base mounting section
1501: Base
1601: Optical module plate
1602: Thermally conductive resin
1603: Printed circuit board
1604: Wire
1605: Optical connector adapter
1606: Screw
1701: Member-2 mounting section
1901: Groove for engagement pin
2001: Long hole for engagement pin
2002: Distance between centers of engagement pins (T4)
2003: Diameter of engagement pin (T5)
2004: Distance along Z-axial direction of long hole for engagement pin
2101: groove for engagement pin
2201: Groove for engagement pin
2301: Groove for fixing
2401: Groove for fixing
2501: Base
2502: Hole
2503: Transparent portion
2504: Second micro-lens array plate
2601: Elastic body
2801: Screw insertion section
2802: Hole
2901: Hole
2901: Overlay
2902: Lid section
2903: Lip section
2904: Plate
2905: Lens plate

What is claimed is:

1. A method for manufacturing an optical module, the method comprising the steps of:
preparing a package with an optical element mounted thereon, a transparent plate having a function for transmitting an optical signal to the optical element, engagement pins, a first member having through-holes with which the engagement pins can be engaged and an opening or a transparent plate through which an optical signal can pass, a micro-lens array plate having grooves or through-holes in which the engagement pins can be inserted, two planes parallel to each other for inputting or outputting an optical signal, and micro lenses arranged on at least one of the planes such that the micro lenses are arranged on a surface of the micro-lens array plate that faces the optical element;
sealing the package by using the transparent plate and a fixing member;
passing the engagement pins through the first member to engage the engagement pins with the first member; and
engaging portions of the engagement pins that have passed through the first member with the grooves or through-holes of the micro-lens array plate; and
optically aligning the micro-lens array plate with the optical element.

2. The method for manufacturing an optical module according to claim 1, the method further comprising the step of:
providing a base at least one of a location between the first member and the transparent plate and a location between the first member and the package so that a distance between the first member and the transparent plate is larger than the thickness of the micro-lens array plate.

3. The method for manufacturing an optical module according to claim 1,
wherein a base having a convex shape is provided on one of the planes of the micro-lens array plate through which an optical signal is transmitted.

4. The method for manufacturing an optical module according to claim 1,
wherein the optical element is provided via the base placed on one plane of the package.

5. The method for manufacturing an optical module according to claim 1, the method further comprising the steps of:
preparing a second micro-lens array plate having second through-holes with which the engagement pins can be engaged;
passing the engagement pins into the second through-holes to engage the engagement pins with the second through-holes and the through-holes formed in the first member and connecting the second micro-lens array plate and the first member in the order from the side away from the optical element; and
engaging a portion of the engagement pins passing through the first member into the grooves or the through-holes and connecting the micro-lens array plate on the side opposed to the second micro lens array via the first member.

6. The method for manufacturing an optical module according to claim 1, the method further comprising of the step of:
providing an elastic body that presses at least a portion of the micro-lens array plate to a side of the transparent plate.

7. The method for manufacturing an optical module according to claim 1,
wherein the micro-lens array plate has two planes perpendicular to each other through which an optical signal goes out or comes in and a reflection surface inclined at a angle of about 45 degrees relative to the two planes, in which the micro lenses are arranged on at least one of the planes.

8. The method for manufacturing an optical module according to claim 7,
wherein the first member is arranged on a side where an optical signal comes in and goes out and is parallel to a main plane of the transparent plate so that the micro-lens array plate can be engaged with the engagement pins.

9. The method for manufacturing an optical module according to claim 7,
wherein the first member is arranged on a side where an optical signal does not come in and does not go out and is parallel to the main plane of the transparent plate so that the micro-lens array plate is engaged with the engagement pins.

10. A method for manufacturing an optical module, the method comprising the steps of:
preparing a package with an optical element mounted thereon, a transparent plate having a function for transmitting an optical signal to the optical element, engagement pins, a second member having through-holes with which the engagement pins can be engaged so that the engagement pins are perpendicular to a main plane of the transparent plate, a micro-lens array plate having two planes in parallel to each other through which an optical signal is input and output, a reflection surface having an angle of 45 degrees relative to the two planes, grooves or through-holes into which the engagement pins can be inserted so that the engagement pins are perpendicular to the main plane of the transparent plate, grooves or through-holes into which the engagement pins can be inserted so that the engagement pins are horizontal to the main plane of the transparent plane, and micro lenses arranged on at least one of the two planes such that the micro lenses are arranged on a surface of the micro-lens array plate that faces the optical element;
sealing the package by using the transparent plate and a fixing member;
passing the engagement pins through the second member to engage the engagement pins with the second member;
optically aligning the micro-lens array plate with the optical element; and
fixing the second member to a portion of the package or the transparent plate.

11. The method for manufacturing an optical module according to claim 10, the method further comprising the step of:
arranging a third member for engaging or fixing the engagement pins to be engaged in substantially parallel to the transparent plate on a first side where an optical signal on the package is input and output or on a second side opposite to a first side where an optical signal is input and output.

12. The method for manufacturing an optical module according to claim 10, the method further comprising the step of:
providing a base at least one of a location between the second member and the transparent plate and a location between the second member and the package so that a distance between the second member and the transparent plate is larger than the thickness of the micro-lens array plate.

13. The method for manufacturing an optical module according to claim 10,
wherein a base having a convex shape is provided on one of the planes where the optical signal transmitted by the micro-lens array plate is transmitted.

14. The method for manufacturing an optical module according to claim 10,
wherein the optical element is provided via the base provided on one plane of the package.

15. The method for manufacturing an optical module according to claim 10, the method further comprising the steps of:
preparing a second micro-lens array plate having second through-holes with which the engagement pins can be engaged;
passing the engagement pins through the second through-holes and the through-holes formed in the first member and connecting the second micro-lens array plate and the first member in the order from a side of inputting and outputting of optical signals; and
engaging portions of the engagement pins passing through the first member with the grooves or the through-holes and connecting the micro-lens array plate on a side opposite to the second micro-lens array plate via the first member.

16. The method for manufacturing an optical module according to claim 10, the method further comprising the step of:
providing an elastic body that presses at least a portion of the micro-lens array plate toward the transparent plate.

17. A method for manufacturing an optical module, the method comprising the steps of:
preparing a package with an optical element mounted thereon, a transparent plate comprising an inorganic material and having a function for transmitting an optical signal through the inorganic material to the optical element, engagement pins, a first member having through-holes with which the engagement pins can be engaged and an opening or a transparent plate through which an optical signal can pass, a micro-lens array plate having grooves or through-holes in which the engagement pins can be inserted, two planes parallel to each other for inputting or outputting an optical signal, and micro lenses arranged on at least one of the planes;

sealing the package by using the transparent plate and a fixing member;

passing the engagement pins through the first member to engage the engagement pins with the first member; and engaging portions of the engagement pins that have passed through the first member with the grooves or through-holes of the micro-lens array plate; and optically aligning the micro-lens array plate with the optical element.

* * * * *